United States Patent [19]
Williams

[11] Patent Number: 5,990,810
[45] Date of Patent: Nov. 23, 1999

[54] METHOD FOR PARTITIONING A BLOCK OF DATA INTO SUBBLOCKS AND FOR STORING AND COMMUNCATING SUCH SUBBLOCKS

[76] Inventor: Ross Neil Williams, 3/305 N. Terrace, Adelaide SA5000, Australia

[21] Appl. No.: 08/894,091

[22] PCT Filed: Feb. 15, 1996

[86] PCT No.: PCT/AU96/00081

§ 371 Date: Aug. 15, 1997

§ 102(e) Date: Aug. 15, 1997

[87] PCT Pub. No.: WO96/25801

PCT Pub. Date: Aug. 22, 1996

[30] Foreign Application Priority Data

Feb. 17, 1995 [AU] Australia .................................. PN1232
Apr. 12, 1995 [AU] Australia .................................. PN2392

[51] Int. Cl.⁶ ............................................. H03M 7/00
[52] U.S. Cl. ................................................. 341/51; 341/67
[58] Field of Search ................................ 341/51, 50, 67; 375/241; 704/203

[56] References Cited

U.S. PATENT DOCUMENTS

| | | | |
|---|---|---|---|
| 4,698,628 | 10/1987 | Herkert et al. | 340/825.02 |
| 5,235,623 | 8/1993 | Sugiyama et al. | 341/67 |
| 5,479,654 | 12/1995 | Squibb | 395/600 |

OTHER PUBLICATIONS

Williams, Ross, "An algorithm for matching text (possibly original)", Newsgroup posting, comp.compression, Jan. 27, 1992.

Williams, Ross, "Parallel data compression", Newsgroup posting, comp.conmpression.research, Jun. 30, 1992.

Knuth, Donald E., "The Art of Computer Programming, vol. 3: Sorting and Searching", pp. 508–513, Addison–Wesley Publishing Company, 1973.

Williams, Ross N., "An Introduction to Digest Algorithms" Proceedings of the Digital Equipment Computer Users Society, pp. 9–18, Aug. 1994.

Williams, Ross N., "An Extremely Fast ZIV–Lempel Data Compression Algorithm", Proceedings of Data Compression Conference, pp. 362–371, Apr. 1991.

Knuth, Donald E., The Art of Computer Programming, vol. 1: Fundamental Algorithms, pp. 435–451, Addison Wesley Publishing Company, 1973.

*Primary Examiner*—Brian Young
*Attorney, Agent, or Firm*—Greenberg Traurig; Robert P. Bell

[57] ABSTRACT

This invention provides a method and apparatus for detecting common spans within one or more data blocks by partitioning the blocks (FIG. 4) into subblocks and searching the group of subblocks (FIG. 12) (or their corresponding hashes (FIG. 13)) for duplicates. Blocks can be partitioned into subblocks using a variety of methods, including methods that place subblock boundaries at fixed positions (FIG. 3), methods that place subblock boundaries at data-dependent positions (FIG. 3), and methods that yield multiple overlapping subblocks (FIG. 6). By comparing the hashes of subblocks, common spans of one or more blocks can be identified without ever having to compare the blocks or subblocks themselves (FIG. 13). This leads to several applications including an incremental backup system that backs up changes rather than changed files (FIG. 25), a utility that determines the similarities and differences between two files (FIG. 13), a file system that stores each unique subblock at most once (FIG. 26), and a communications system that eliminates the need to transmit subblocks already possessed by the receiver (FIG. 19).

30 Claims, 26 Drawing Sheets

| Demonstr | ates con | tent mis | alignmen | t. |
| XDemonst | rates co | ntent mi | salignme | nt. |

Figure 1

| Fixed an | d variab | le width | partiti | oning. |
| Fixe | d an | d variable wid | th part | itioning. |

Figure 2

| Data-indep | endent     pa | titioning. |
| XData-inde | pendent pa | rtitioning | . |

| Data-dep | edent | partiti | oning. |
| XData-dep | endent partiti | oning. |

Figure 3

_METHOD FOR PARTITIONING A BLOCK OF DATA INTO SUBBLOCKS AND FOR STORING AND COMMUNCATING SUCH SUBBLOCKS_

INTRODUCTION

The present invention provides a method and apparatus for partitioning one or more blocks of data into subblocks for the purpose of communicating and storing such subblocks in an efficient manner.

BACKGROUND

Much of the voluminous amount of information stored, communicated, and manipulated by modern computer systems is duplicated within the same or a related computer system. It is commonplace, for example, for computers to store many slightly differing versions of the same document. It is also commonplace for data transmitted during a backup operation to be almost identical to the data transmitted during the previous backup operation. Computer networks also must repeatedly carry the same or similar data in accordance the requirements of their users.

Despite the obvious benefits that would flow from a reduction in the redundancy of communicated and stored data, few computer systems perform any such optimization. Some instances can be found at the application level, one example being the class of incremental backup utilities that save only those files that have changed since the most recent backup. However, even these utilities do not attempt to exploit the significant similarities between old and new versions of files, and between files sharing other close semantic ties. This kind of redundancy can be approached only by analysing the contents of the files.

The present invention addresses the potential for reducing redundancy by providing an efficient method for identifying identical portions of data within a group of blocks of data, and for using this identification to increase the efficiency of systems that store and communicate data.

SUMMARY OF THE INVENTION

To identify identical portions of data within a group of blocks of data, the blocks must be analysed. One simple approach is to divide the blocks into fixed-length (e.g. 512-byte) subblocks and compare these with each other so as to identify all identical subblocks. This knowledge can the be used to manage the blocks in more efficient ways.

Unfortunately, the partitioning of blocks into fixed-length subblocks does not always provide a suitable framework for the recognition of duplicated portions of data, as identical portions of data can occur in different sizes and places within a group of blocks of data. FIG. 1 shows how division into fixed-size subblocks of two blocks (whose only difference is the insertion of a single byte ('X')) fails to generate identical subblocks. A comparison of the two groups of subblocks would reveal no identical pairs of subblocks even thought the two original blocks differ by just one character.

A better approach is to partition each block using the data in the block itself to determine the position of the partitions.

In an aspect of the invention, the blocks are partitioned at boundaries determined by the content of the data itself. For example, a block could be partitioned at each point at which the preceding three bytes has to a particular constant value. FIG. 2 shows how such a data dependent partitioning could turn out, and contrasts it with a fixed-length partitioning. In FIG. 3 data independent partitioning generates seven distinct subblocks whereas the data-dependent partitioning generates just four, allowing much of the similarity between the two blocks to be detected.

The fact that a partitioning is data dependent does not imply that it must incorporate any knowledge of the syntax or semantics of the data. So long as the boundaries are positioned in a manner dependent on the local data content, identical subblocks are likely to be formed from identical portions of data, even if the two portions are not identically aligned relative to the start of their enclosing blocks (FIG. 3).

Once the group of blocks has blocks has been partitioned into subblocks, the resulting group of subblocks can be manipulated in a manner that exploits the occurrence of duplicate subblocks. This leads to a variety of applications, some of which are described below. However, the application of a further aspect of the invention leads to even greater benefits.

In a further aspect of the invention, the hash of one or more subblocks is calculated. The hash function can be an ordinary hash function or one providing cryptographic strength. The hash function maps each subblock into a small tractable value (e.g. 128 bits) that provides an identity of the subblock. These hashes can usually be manipulated more efficiently than their corresponding subblocks.

Some applications of aspects of this invention are:

Fine-grained incremental backups: Conventional incremental backup technology uses the file as the unit of backup. However, in practice many large files change only slightly, resulting in a wasteful re-transmission of changed files. By storing the hashes of subblocks of the previous versions of files, the transmission of unchanged subblocks can be eliminated.

Communications: By providing a framework for communicating the hashes of subblocks, the invention can eliminate the transmission of subblocks already possessed by the receiver.

Differences: The invention could be used as the basis of a program that determines the areas of similarity and difference between two blocks.

Low-redundancy file system: Data stored in a file system can be partitioned into subblocks whose hashes can be compared so as to eliminate the redundant storage of identical subblocks.

Virtual memory: Virtual memory could be organized by subblock using a table of hashes to determine if a subblock is somewhere in memory.

Clarification of Terms

The term block and subblock both refer, without limitation, to finite blocks or infinite blocks (sometimes called streams) of zero or more bits or bytes of digital data. Although the two different terms ("blocks" and "subblock") essentially describe the same substance (digital data), the two different terms have been employed in this specification to indicate the role that a particular piece of data is playing. The term "block" is usually used to refer to raw data to be manipulated by aspects of the invention. The term "subblock" is usually used to refer to a part of a block. "Blocks" are "partitioned" into "subblocks".

The term partition has its usual meaning of exhaustively dividing an entity into mutually exclusive parts. However, within this specification, the term also includes cases where:

Not all of the block is subdivided.

Multiple overlapping subblocks are formed.

A natural number is a non-negative integer (0, 1, 2, 3, 4, 5, . . . ).

Where the phrase zero or more is used, this phrase is intended to encompass the degenerate case where the objects being enumerated are not considered at all, as well as the case where zero or more objects are used.

BRIEF DESCRIPTION

The following aspects of this invention are numbered for reference purposes. The terms "block" and "subblock" refer to blocks and subblocks of digital data.

1. In an aspect of the invention, the invention provides a method for organizing a block b of digital data for the purpose of storage, communication, or comparison, by partitioning said block into subblocks at one or more positions $k|k+1$ within said block for which $b[k-A+1 \ldots k+B]$ satisfies a predetermine constraint, where A and B are natural numbers.

Note: The specification of this aspect encompasses the degenerate case in which either A or B is zero. The specification also includes the case where the constraint does not pay attention to some parts of $b[k-A+1 \ldots k+B]$. For example, a constraint that pays attention only to (say) $b[k-3]$ and $b[k+2]$ would fall under the classes of constraint corresponding to $A \geq 4$ and $B \geq 2$.

2. In a further aspect of the invention, the invention provides a method according to aspect 1 in which the constraint comprises the hash of some or all of $b[k-A+1 \ldots k+B]$.

3. In a further aspect of the invention, the invention provides a method according to aspect 1, for locating the nearest subblock boundary on a side of a position $p|p+1$ within a said block, comprising the step of:

a. Evaluating whether said predetermined constraint is satisfied at each position $k|k+1$, for increasing (or decreasing) k, where k starts with the value p.

4. In a further aspect of the invention, the invention provides a method according to aspect 1, wherein one or more bounds are imposed on the size of one or more subblocks.

5. In a further aspect of the invention, the invention provides a method according to aspect 1, wherein additional subblocks are formed from one or more groups of subblocks.

6. In a further aspect of the invention, the invention provides a method according to aspect 1, wherein an additional hierarchy of subblocks is formed from one or more groups of contiguous subblocks.

7. In a further aspect of the invention, the invention provides a method according to one of aspects 1 to 6, comprising the further step of:

b. Calculating the hash of each of one or more of said subblocks.

Note: The resulting collection of hashes is particularly useful if H is a strong one-way hash function.

8. In a further aspect of the invention, the invention provides a method according to one of aspects 1 to 6, comprising the further step of:

b. Forming a projection of said block, being an ordered or unordered collection of elements, wherein each element consists of a subblock, an identity of a subblock, or a reference of a subblock.

Note: The specification of this aspect is intended to admit collections that contain a mixture of various kinds of identities and references.

Note: In most applications, the output of this aspect will be an ordered list of hashes of the subblocks of the block.

9. In a further aspect of the invention, the invention provides a method for comparing one or more blocks, comprising the steps of:

a. Partitioning one or more of said blocks into one or more subblocks in accordance with one of aspects 1 to 6.

b. Forming a projection of each said block, being an ordered or unordered collection of elements, wherein each element consists of a subblock, an identity of a subblock, or a reference of a subblock.

c. Comparing the elements of said projections of said blocks.

10. In a further aspect of the invention, the invention provides a method for representing one or more blocks, comprising:

(i) A collection of subblocks;

(ii) Block representatives (e.g. filenames) which are mapped to lists of entries that identify subblocks;

whereby the modification of one of said blocks involves the following steps:

a. Partitioning some or all of said modified block into subblocks in accordance with one of aspects 1 to 6;

b. Adding to said collection of subblocks zero or more subblocks that are not already in said collection, and updating said subblock list associated with said modified block.

11. In a further aspect of the invention, the invention provides a method according to aspect 10, in which step b is replaced by:

b. Removing from said collection of subblocks zero or more subblocks, and updating said subblock list associated with said modified block.

12. In a further aspect of the invention, the invention provides a method according to aspect 10, in which step b is replaced by:

b. Adding to said collection of subblocks zero or more subblocks that are not already in the collection, removing from said collection of subblocks zero or more subblocks, and updating said subblock list associated with said modified block.

13. In a further aspect of the invention, the invention provides a method for an entity E1 to communicate a block X to E1 where E1 possesses the knowledge that E2 possesses a group Y of subblocks $Y_1 \ldots Y_m$, comprising the following steps:

a. Partitioning X into subblocks $X_1 \ldots X_n$ in accordance with one of aspects 1 to 6;

b. Transmitting from E1 to E2 the contents of zero or more subblocks in X, and the remaining subblocks as references to subblocks in $Y_1 \ldots Y_m$ and to subblocks already transmitted.

Note: In most implementations of this aspect, the subblocks whose contents are transmitted will be those in X that are not in Y, and for which no identical subblock has previously been transmitted.

Note: To posses knowledge that E2 possesses $Y_1 \ldots Y_m$, E1 need not actually posses $Y_1 \ldots Y_m$ itself. E1 need only posses the identities of $Y_1 \ldots y_m$ (e.g. the hashes of each subblock $Y_1 \ldots Y_m$). This specification is intended to admit any other representation in which E1 may have the knowledge that E2 possesses (or has access to) $Y_1 \ldots Y_m$. In particular, the knowledge may take the form of a projection of Y.

Note: It is implicit in this aspect the E1 will be able to use comparison (or other methods) to use its knowledge of E2's possession of Y to determine the set of subblocks that are common to both X and Y. For example, if E1 possessed the hashes of the subblocks of Y, it could compare them to the hashes of the subblocks of X to determine the subblocks common to both X and Y. Subblocks that are not common can be transmitted explicitly. Subblocks that are common to both X and Y can be transmitted by transmitting a reference to the subblock.

14. In a further aspect of the invention, the invention provides a method for an entity E1 to communicate one or more subblocks of a group X of subblocks $X_1 \ldots X_n$ to E2 where E1 possesses the knowledge that E2 possesses the blocks Y, comprising the following steps:

a. Partitioning Y into subblocks $Y_1 \ldots Y_m$ in accordance with one or aspects 1 to 6;

b. Transmitting from E1 to E2 the contents of zero or more subblocks in X, and the remaining subblocks as references to subblocks in Y and to subblocks already transmitted.

15. In a further aspect of the invention, the invention provides a method for an entity E1 to communicate a block X to E2 where E1 possesses the knowledge that E2 possesses block Y, comprising the following steps:

a. Partitioning in accordance with one of aspects 1 to 6, X into subblocks $X_1 \ldots X_n$ and Y into subblocks $Y_1 \ldots Y_m$;

b. Transmitting from E1 to E2 the contents of subblocks in X, and the remaining subblocks as references to subblocks in Y and to subblocks already transmitted.

16. In a further aspect of the invention, the invention provides a method for constructing a block D from a block X and a group Y of subblocks $Y_1 \ldots Y_m$ such that X can be constructed from Y and D, comprising the following steps:

a. Partitioning X into subblocks $X_1 \ldots X_n$ in accordance with one of aspects 1 to 6;

b. Constructing D from one or more of the following: the contents of zero or more subblocks in X, references to zero or more subblocks in Y, and references to zero or more subblocks in D.

Note: Step b above is intended to encompass the case where a mixture of the elements it describes is used.

17. In a further aspect of the invention, the invention provides a method for constructing a block D from a group X of subblocks $X_1 \ldots X_n$ and a block Y such that X can be constructed from Y and D, comprising the following steps:

a. Partitioning Y into subblocks $Y_1 \ldots Y_m$ in accordance with one of aspects 1 to 6;

b. Constructing D from one or more of the following: the contents of zero or more subblocks in X, references to zero or more subblocks in Y, and references to zero or more subblocks in D.

18. In a further aspect of the invention, the invention provides a method for constructing a block D from a block X and a block Y such that X can be constructed from Y and D, comprising the following steps:

a. Partitioning in accordance with one of aspects 1 to 6, X into subblocks $X_1 \ldots X_n$ and Y into subblocks $Y_1 \ldots Y_m$;

b. Constructing D from one or more of the following: the contents of zero or more subblocks in X, references to zero or more subblocks in Y, and references to zero or more subblocks in D.

19. In a further aspect of the invention, the invention provides a method for constructing a block D from a block X and a projection of Y, said projection comprising an ordered or unordered collection of elements wherein each element consists of a subblock in Y, an identity of a subblock in Y, or a reference of a subblock in Y, such that X can be constructed from Y and D, comprising the following steps:

a. Partitioning X into subblocks $X_1 \ldots X_n$ in accordance with one of aspects 1 to 6;

b. Constructing D from one or more of the following: the contents of zero or more subblocks in X, references to zero or more subblocks in Y, and references to zero or more subblocks in D.

20. In a further aspect of the invention, the invention provides a method for constructing a block X from a block Y and a block D, comprising the following steps:

a. Partitioning Y into subblocks $Y_1 \ldots Y_m$ in accordance with one or aspects 1 to 6;

b. Constructing X from D and Y by constructing the subblocks of X based on one or more of:

(i) subblocks contained within D;

(iii) references in D to subblocks in Y;

(iii) references in D to subblocks in D;

21. In a further aspect of the invention, the invention provides a method for constructing a group X of subblocks $X_1 \ldots X_n$ from a block Y and a block D, comprising the following steps:

a. Partitioning Y into subblocks $Y_1 \ldots Y_m$ in accordance with one of aspects 1 to 6;

b. Constructing $X_1 \ldots X_n$ from D and Y based on one or more of:

(i) subblocks contained within D;

(iii) references in D to subblocks in Y;

(iii) references in D to subblocks in D;

22. In a further aspect of the invention, the invention provides a method for communicating a data block X from one entity E1 to another entity E2 comprising the following steps:

a. Partitioning X into subblocks $X_1 \ldots X_n$ in accordance with one of aspects 1 to 6;

b. Transmitting from E1 to E2 an identity of one or more subblocks;

c. Transmitting from E2 to E1 information communicating the presence or absence of subblocks at E2;

d. Transmitting from E1 to E2 at least the subblocks identified in step (c) as not being present at E2.

Note: The information communicated in step (c) could take the form of a bitmap (or a compressed bitmap) corresponding to the subblocks referred to in step (a). It could also take many other forms.

Note: If a group of subblocks are to be transmitted, the above steps could be performed completely for each subblock before moving onto the next subblock. The steps could be applied to any subgroup of subblocks.

23. In a further aspect of the invention, the invention provides a method for communicating a block X from one entity E1 to another entity E2, comprising the following steps:

a. Partitioning X into subblocks $X_1 \ldots X_n$ in accordance with one of aspects 1 to 6;

b. Transmitting from E2 to E1 information communicating the presence or absence at E2 of members of a group Y or subblocks $Y_1 \ldots Y_m$;

c. Transmitting from E1 to E2 the contents of zero or more subblocks in X, and the remaining subblocks as references to subblocks in $Y_1 \ldots Y_m$ and to subblocks transmitted.

24. In a further aspect of the invention, the invention provides a method for an entity E2 to communicate to an entity E1 the fact that E2 possesses a block Y, comprising the following steps:

a. Partitioning Y into subblocks $Y_1 \ldots Y_m$ in accordance with one or aspects 1 to 6;

b. Transmitting from E2 to E1 references of the subblocks $Y_1 \ldots Y_m$.

25. In a further aspect of the invention, the invention provides a method for an entity E1 to communicate a subblock $X_i$ to an entity E2, comprising the following steps:

a. Partitioning X into subblocks $X_1 \ldots X_n$ in accordance with one of aspects 1 to 6;

b. Transmitting from E2 to E1 an identity of $X_i$;

c. Transmitting $X_i$ from E1 to E2.

Note: This aspect applies (among other applications) to the case of a network server E1 that serves subblocks to clients such as E2, given the identities (e.g. hashes) of the requested subblocks.

26. In a further aspect of the invention, the invention provides a method according to one of aspects 1 to 6, wherein said subblocks are compared by comparing the hashes of said subblocks.

27. In a further aspect of the invention, the invention provides a method according to one of aspects 1 to 6, wherein subsets of identical subblocks within a group of one or more subblocks are found, by inserting each subblock, an identity of each subblock, a reference of each subblock, or a hash of each subblock, into a data structure.

28. In further aspect of the invention, the invention provides an apparatus for organizing a block b of digital data for the purpose of storage, communication, or comparison, by partitioning said block into subblocks at one or more positions k|k+1 within said block for which b[k−A+1 . . . k+B] satisfies a predetermined constraint, where A and B are natural numbers.
Note: The specification of this aspect encompasses the degenerate case in which either A or B is zero. The specification also includes the case where the constraint does not pay attention to some parts of b[k−A+1 . . . k+B]. For example, a constraint that pays attention only to (say) b[k−3] and b[k+2] would fall under the classes of constraint corresponding to $A \geq 4$ and $B \geq 2$.

29. In a further aspect of the invention, the invention provides an apparatus according to aspect 28 in which the constraint comprises the hash of some or all of b[k−A+1 . . . k+B].

30. In a further aspect of the invention, the invention provides an apparatus according to aspect 28, for locating the nearest subblock boundary on a side of a position p|p+1 within a said block, comprising the step of:

a. Evaluating whether said predetermined constraint is satisfied at each position k|k+1, for increasing (or decreasing) k, where k starts with the value p.

BRIEF DESCRIPTION OF FIGURES

FIG. 1 shows how data can become "misaligned" relative to its containing blocks when data is inserted.

FIG. 2 shows how data can be divided into fixed-width subblocks or variable-width subblocks.

FIG. 3 shows how data-dependent partition move with the data when the data is shifted (e.g. by an insertion) H.

DETAILED DESCRIPTION OF PREFERRED EMBODIMENTS

Figure 4:
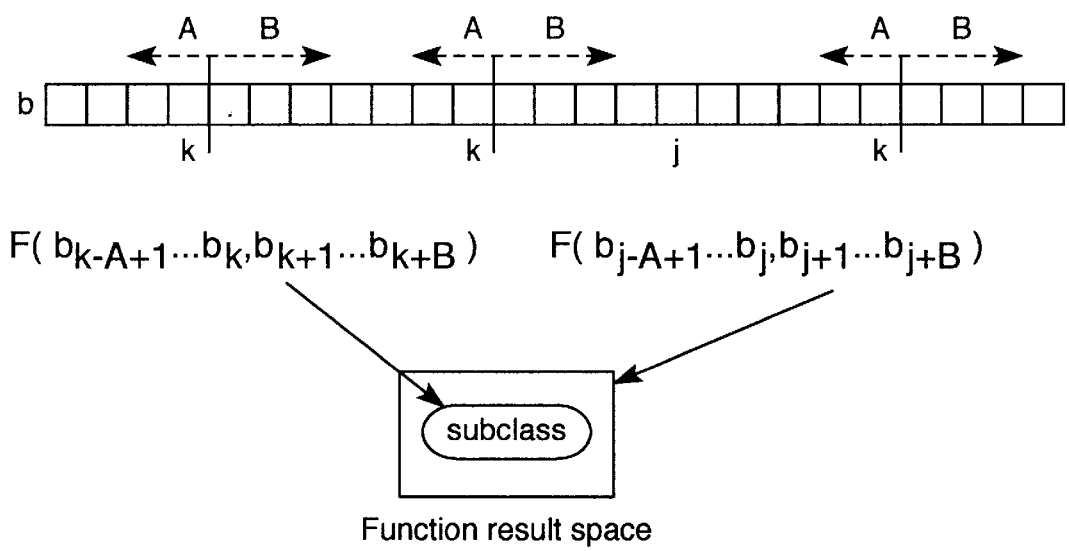
FIG. 4 depicts the data-dependent partitioning of a block b of data into subblocks using a constraint F.
Figure 5:
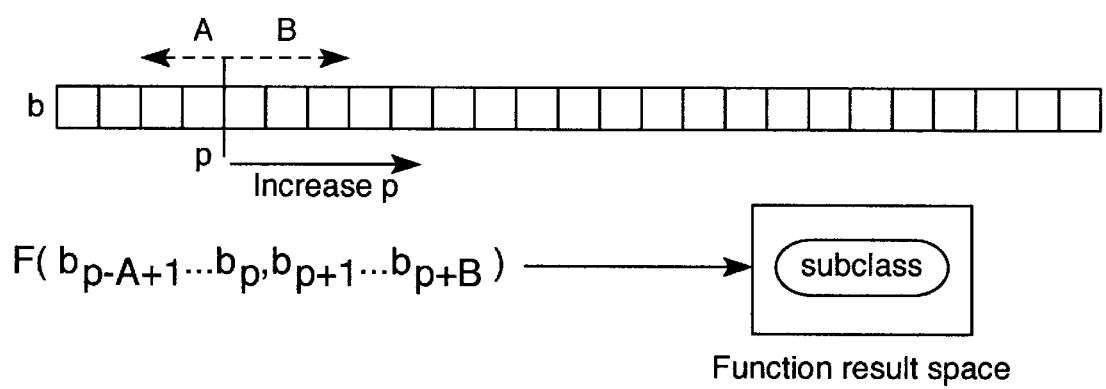
FIG. 5 depicts the search within a block b for a subblock boundary using a constraint F.
Figure 6:
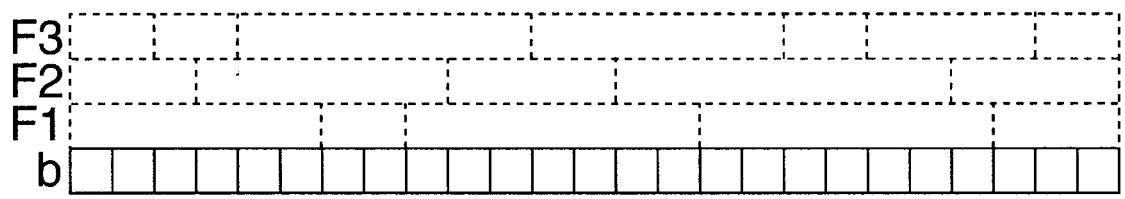
FIG. 6 shows how a block may be subdivided in different ways using different partitioning constraints.
Figure 7:
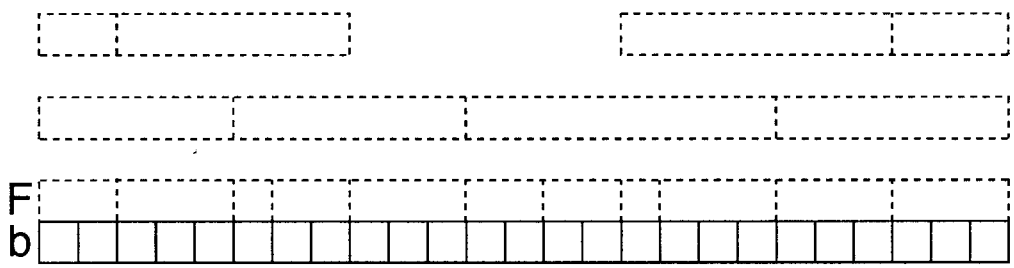
FIG. 7 shows how "higher order" subblocks can be constructed from one or more initial subblocks.

This section contains a detailed discussion of mechanisms that could be used to implement aspects of the invention. It also contains examples of implementations of selected aspects of the invention. However, nothing in this section should be interpreted as a limitation on the scope of this patent.

Units of Information

Aspects of this invention can be applied at various levels of granularity of data. For example, if the data was treated as a stream of bits, boundaries could be placed between any two bits. However, if the data was treated as a stream of bytes, boundaries would usually be positioned only between bytes. The invention could be applied with any unit of data, and in this document references to bits and bytes should usually be interpreted as admitting any granularity.

The Concept of Entity

At various places, this patent specification uses the term "entity" to describe an agent. This term is purposefully vague and is intended to cover all forms of agent including, but not limited to:

Computer systems.
Networks of computer systems.
Processes in computer systems.
File systems.
Components of software.
Dedicated computer systems.
Communications systems.

The Concepts of Identity and Reference

This patent specification frequently refers to "identities" of subblocks and "references" to subblocks. These terms are not intended to be defined precisely.

The identity of a subblock means any piece of information that could be used in place of the subblock for the purpose of comparison for identicality. Identities include, but are not limited to:

The subblock itself.
A hash of the subblock.

The subblock acts as its own identity because subblocks themselves can be compared with each other. Hashes of subblocks also act as identities of subblocks because hashes of subblocks can be compared with each other to determine if their corresponding subblocks are identical.

A reference to a subblock means any piece of information that could be used in practice by one entity to identify to another entity (or itself) a particularly valued subblock, where the two entities may already share some knowledge. For example, the two entities might each possess the knowledge that the other entity already possesses ten subblocks of known values having particular index values numbered one to ten.

Once two entities have a basis of shared knowledge, it is possible for them to identify a subblock in ways more concise than the transmission of an identity. A reference to a particularly valued subblock can take (without limitation) the following forms:

An identity.
An identifying number of a subblocks possessed by the receiver.
An identifying number of a subblock previously transmitted between the two communicants.
The location of the subblock in some shared data space.
As relative subblocks number.
Ranges of the above.

The concept of knowledge of a subblock is related to the concepts of identity and reference. An entity may have knowledge of a subblock (or knowledge that another entity possesses a subblock) without actually possessing the subblock itself. For example, it might possess an identity of the subblock or a reference to the subblock.

The Use of Ranges

In any situation where a group of values that have contiguous values (e.g. 6, 7, 8, 9) is to be communicated or stored, such a group can be represented using a range (e.g. 6–9) which may take up less communication time or storage space. Ranges can be applied to all kinds of things, such as index values and subblock numbers. In particular, if an entity notices that the references (to subblocks) that it is about to transmit are contiguous, it can replace the references with a range.

Ranges can be represented in any way that identifies the first and last element of the range. Three common representations are:

The first and last element of the range.
The first element and the length of the range.
The last element and the length of the range.

The concept of range can be generalized to include the compression of any group of values that exhibit compressible structure.

The Use of Backward References

References can be used not only to refer to data shared by two communicants at the start of a transmission, but can also be used to refer to data communicated at some previous time during the transmission.

For example, if an entity A notices that the subblock it is about to transmit to another entity B was not possessed by B at the start of the transmission, but has since been transmitted from A to B, then A could code the second instance of the subblock as a reference to the previous instance of the subblock. The range mechanism can be used here too.

No Requirement for Subblock Framing Information

It is possible that an entity E1 could transmit a group X of subblocks $X_1 \ldots X_n$ as a group to an entity E2 simply by sending the concatenation of the subblocks. There may be no need for any framing information (e.g. information at the start of each subblock giving the length of the subblock or "escape" codes to indicate subblock boundaries), as E2 is capable of partitioning X into $X_1 \ldots X_n$ itself.

No Requirement for Ordering Subblocks

If two entities E1 and E2 both possess the same unordered group Y of subblocks (or knowledge of such a group of subblocks) then even though E1 and E2 may not possess the subblocks in the same order, the subblocks can still be referred to using a subblock index or serial number. This is achieved by having E1 and E2 each sort their subblocks in accordance with some mutually agreed (or universally defined) ordering method and then number the subblocks in the resultant ordered group of subblocks. These number (or ranges of such numbers) can then be used to refer to the subblocks.

An Overview of Hash Functions

Although the use of a hash function is not essential in all aspects of this invention, hash functions provide such advantages in the implementation of this invention that an overview of them is warranted.

A hash function accepts a variable-length input block of bits and generates an output block of bits that is based on the input block. Most hash functions guarantee that the output block will be of a particular length (e.g. 16 bits) and aspire to provide a random, but deterministic, mapping between the infinite set of input blocks and the finite set of output blocks. The property of randomness enables these outputs, called "hashes", to act as easily manipulated representatives of the original block.

Hash functions come in at least four classes of strength.

Narrow hash functions: Narrow hash functions are the weakest class of hash functions and generate output values that are so narrow (e.g. 16 bits) that the entire space of output values can be searched in a reasonable amount of time. For example, an 8-bit hash function would map any data block to a hash in the range 0 to 155. A 16-bit has function would map to a hash in the range 0 to 65535. Given a particular hash value, it would be possible to find a corresponding block simply by generating random blocks and feeding them into the narrow hash function until the searched-for value appeared. Narrow hash functions are usually used to arbitrarily (but deterministically) classify a set of data values into a small number of groups. As such, they are useful for constructing hash table data structures, and for detecting errors in data transmitted over noisy communication channels. Examples of this class: CRC-16, CRC-32. Fletcher checksum, the IP checksum.

Wide hash functions: Wide hash functions are similar to narrow hash functions except that their output values are significantly wider. At a certain point this quantitative difference implies a qualitative difference. In a wide hash function, the output value is so wide (e.g. 128 bits) that the probability of any two randomly chosen blocks having the same hashed value is negligible (e.g. about one in $10^{38}$). This property enables these wide hashes to be used as "identities" of the blocks of data from which they are calculated. For example, if entity E1 has a block of data and sends the wide hash of the block to an entity E2, then if entity E2 has a block that has the same hash, then the a-priori probability of the blocks actually being different is negligible. The only catch is that wide hash functions are not designed to be non-invertible. Thus, while the space of (say)$2^{128}$ values is too large to search in the manner described for narrow hash functions, it may be easy to analyse the hash function and calculate a block corresponding to a particular hash. Accordingly, E1 could fool E2 into thinking E1 had one block when it really had a different block. Examples of this class: any 128-bit CRC algorithm.

Weak one-way hash functions: Weak one-way hash functions are not only wide enough to provide "identity", but they also provide cryptographic assurance that it will be extremely difficult, given a particular hash value, to find a block corresponding to that hash value. Examples of this class: a 64-bit DES hash.

Strong one-way has functions: Strong one-way hash functions are the same as weak one-way hash functions except that they have the additional property of providing cryptographic assurance that it is difficult to find any two different blocks that have the same hash value, where the hash value is unspecified. Examples of this class: MD4, MD5, and SHA-1.

These four classes of hash provide a range of hashing strengths from which to choose. As might be expected, the speed of a hash function decreases with strength, providing a tradeoff, and different strengths are appropriate in different applications. However, the difference is small enough to admit the use of strong one-way hash functions in all but the most time-critical applications.

The term cryptograpic hash is often used to refer to hashes that provide cryptographic strength, encompassing both the class of weak one-way hash functions and the class of strong one-way hash functions. However, as strong one-way hash functions are almost preferable to weak one-way hash functions, the term "cryptographic hash" is used mainly to refer to the class of strong one-way hash functions.

The present invention can employ hash functions in at least two roles:

1. To determine subblock boundaries.
2. To generate subblock identities.

Depending on the application, hash functions from any of the four classes above could be employed in either role. However, as the determination of subblock boundaries does not require identity or cryptographic strength, it would be inefficient to use hash functions from any but the weakest class. Similarly, the need for identity, the ever-present threat of subversion, and the minor performance penalty for strong one-way hash functions (compared to weak ones) suggests that nothing less than strong one-way hash functions should be used to calculate subblock identities.

The security dangers inherent in employing anything less than a strong one-way hash function to generate identities can be illustrated by considering a communications system or file system that incorporates the invention using any such weaker hash function. In such a system, an intruder could modify a subblock (to be manipulated by a target system) in such a way that the modified subblock has the same a hash as another subblock known by the intruder to be already present in the target system. This could result in the target system retaining its existing subblock rather than replacing it by a new one. Such a weakness could be used (for example) to prevent a target system from properly applying a security patch retrieved over a network.

Thus, while wide has functions could be safely used to calculate subblocks in systems not exposed to hostile humans, even weak one-way hash functions are likely to be insecure in those systems that are.

We now turn to the ways in which hashes of blocks or subblocks can actually be used.

The Use of Cryptographic Hashes

The theoretical properties of cryptographic hashes (and here is meant strong one-way hash functions) yield particularly interesting practical properties. Because such hashes are significantly wide, the probability of two randomly-chosen subblocks having the same hash is practically zero (for a 128-bit hash, it is about one in $10^{38}$), and because it is computationally infeasible to find two subblocks having the same hash, it is practically guaranteed that no intelligent agent will be able to do so. The implication of these properties is that from a practical perspective, the finite set of hash values for a particular cryptographic hash algorithm is one-to-one with the infinite set of finite variable length subblocks. This theoretically impossible property manifests itself in practice because of the practical infeasibility of finding two subblocks that hash to the same value.

This property means that, for the purposes of comparison (for identically), cryptographic hashes may safely be used in place of the subblocks from which they were calculated. As most cryptographic hashes are only about 128 bits long, hashes provide an extremely efficient way to compare subblocks without requiring the direct comparison of the content of the subblocks themselves. Such comparisons can be used to eliminate many transmissions of information. For example, a subblock $X_1$ on a computer C1 in Sydney could be compared with a subblock $Y_1$ on a computer C2 in Boston by a computer C3 in Paris, with the total theoretical network traffic being just 256 bits (C1 and C2 each send the 128-bit hash of their respective subblocks to C3 for comparison, and C3 compares the two hashes).

Some of the ways in which cryptographic hashes could be used in aspects of this invention are:

Cryptographic hashes can be used to compare two subblocks without having to compare, or requiring access to, the content of the subblocks.

If it is necessary to be able to determine whether a subblock T is identical to one of a group of subblocks, the subblocks themselves need not be stored, just a collection of their hashes. The hash of any candidate subblock can then be compared with the hashes in the collection to establish whether the subblock is in the group of subblocks from which the collection of hashes was generated.

Cryptographic hashes can be used to ensure that the partitioning of a block into subblocks and the subsequent reassembly of the subblocks into a reconstructed block is error-free. This can be done by comparing the hash of the original block with the hash of the reconstructed block.

If an entity E1 calculates the hash of a subblock $X_1$ and transmits it to E2, then if E2 possesses $X_1$, or even just the hash of $X_1$, then E2 can determine without any practical doubt that E1 possesses X1.

If an entity E1 passes a key (consisting of a block of bits) chosen at random to an entity E2, E2 may then prove to E1 that it possesses a subblock by sending E1 the hash of the concatenation of the key and the subblock. This mechanism could be used as an additional check in security applications.

If a group of subblocks must be compared so as to find all subsets of identical subblocks, the corresponding set of hashes of the subblocks may be calculated and compared instead.

Many of the uses of cryptographics hashes for subblocks can also be applied to blocks. For example, cryptographic hashes can be used to determine whether a block has changed at all since it was last backed up. Such a check could eliminate the need for further analysis.

Use of Hashes as a Safety Net

A potential disadvantage of deploying aspects of this invention is that it will add extra complexity to the systems into which it is incorporated. This increased complexity carries the potential to increase the chance of undetected failures.

The main mechanism of complexity introduced by many aspects of the invention is the partitioning of blocks (e.g. files) into subblocks, and the subsequent re-assembly of such subblocks. By partitioning a block into subblocks, a system creates the potential for subblocks to be erroneously added, deleted, rearranged, substituted, duplicated, or in some other way exposed to a greater risk of accidential error.

This risk can be reduced or eliminated by calculating the hash (preferably a cryptographic hash of the block before it is partitioned into subblocks, storing the hash with an entity associated with the block as a whole, and then later comparing the stored hash with a compound hash of the reconstructed block. Such a check would provide a very strong safety net that would virtually eliminate the risk of undetected errors arising from the use of this invention.

Choosing a Partitioning Constraint Function

Although the requirements for the block partitioning constraint (e.g. in the form of a constraint function F) are not stringent, care should be taken to select a function that suits the application to which it is to be applied.

In situation where the data is highly structured and knowledge of the data is available, a choice of an F that tends to place subblock boundaries at positions in the data that correspond to obvious boundaries in the data could be advantageous. However, in general, F should be chosen from the class of narrow hash functions. Use of a narrow hash function for F provides both efficiency and a (deterministic) randomness that will enable the implementation to operate effectively over a wide-range of data.

One of the most important properties of F is the probability that F will place a boundary at any particular point when applied to completely random data. For example, a function with a probability of one would produce a boundary between each bit (or byte), whereas a function with a probability of zero would never produce any boundaries at all. In a real application, a more moderate probability would be chosen (e.g. 1/1024) so as to yield useful subblock sizes. The probability can be tuned to suit the application.

We end this section with an example of a narrow hash function that has been implemented and tested and seems to perform well on a variety of data types. The hash function calculates a hash value from three bytes.

$$H(b_1, b_2, b_3) = ((40543 \times ((b_1 <<8) \otimes (b_2 <<4) \otimes b_3)) >>4) \mid p$$

The following notation has been used. "×" is multiplication. "<<" is left bit shift. ">>" is right bit shift. "$\otimes$" is exclusive or. "|" is modulo. The constant $\rho$ is the inverse of the probability of placing a boundary at an arbitrary position in a randomly generated block of data, and can be set to any integer value in [0,65535]. However, in practice it seems to be advantageous to choose values that are prime (Mersenne primes seem to work well). The value 40543 was chosen carefully in accordance with the hash function design guidelines provided in pages 508–613 of the book:

Knuth D. E., "The Art of Computer Programming: Volume 3: Sorting and Searching", Addison Wesley, 1973.

The function generates a value in the range [0, $\rho$-1] and can be used in practice by placing a boundary at each point where the preceding three bytes hash to a predetermined constant value V. This would imply that its arguments $b_1$ . . . $b_3$ correspond to the argument A in aspect one above. To avoid pathological behaviour in the commonly occurring case of runs of zeros, it is wise to choose a non-zero value for V.

In a real implementation, $\rho$ was set to 511 and V was set to one.

Placing an Upper and Lower Bound on the Subblock Size

The use of data-dependent subblock boundaries provides a way to deterministically partition similar portions of data in a context-independent way. However, if artifical bounds are not placed on the subblock size, particular kinds of data will yield subblocks that are too large or too small to be effective. For example, if a file contains a block of a million identical bytes, any deterministic constraint (that operates at the byte level) must either partition the block into one subblock or a million subblocks. Both alternatives are undesirable.

A solution to this problem is artificially to impose an upper bound U and a lower bound L on the subblock size. There seem to be a limitless number of ways of doing this. Here are some examples:

Upper bound: Subdivide subblocks that are longer than U bytes at the points, U, 2U, 3U, and so on, where U is the chosen upperbound on subblock size.

Upper bound: Subdivide subblocks that are longer than U bytes at points determined by a secondary hash function.

Lower bound: Of the set of boundaries that bound subblocks less than L bytes long, remove those boundaries that are closer to their neighbouring boundaries than their neighbouring boundaries are to their neighbouring boundaries.

Lower bound: If the block is being scanned sequentially, do not place a boundary unless at least L bytes have been scanned since the previous boundary.

Lower bound: Of the set of boundaries that bound subblocks less than L bytes long, remove those boundaries that satisfy some secondary hash function.

Lower bound: Of the set of boundaries that bound subblocks less than L bytes long, remove randomly chosen boundaries until all the resulting subblocks are at least L bytes long.

Many other such schemes could be devised.

The Use of Multiple Partitionings

Figure 8:
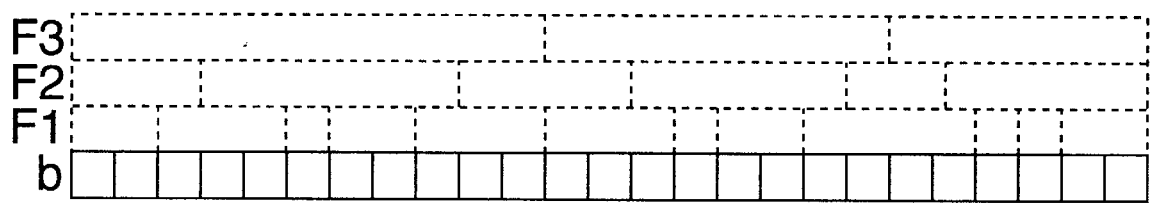
FIG. 8 shows how different partitioning functions can produce subblocks of differing average sizes.

In most applications the use of just one partitioning into subblocks will be sufficient. However, in some applications there may be a need for more than one subblock partitioning. For example, in applications where channel space is expensive, it may be appropriate to partition each block of data in W different ways, using W different constraint functions $F_1 \ldots F_W$ where each function provides a different average subblock size. For example, four different partitions could be performed using functions that provide subblocks of average length 256 bytes, 1K, 10K, and 100K. By providing a range of different sizes of subblocks to choose from, such as organization could simultaneously indicate large blocks extremely efficiently, while still retaining fine-grained subblocks so that minor changes to the data do not result in voluminous updates (FIG. 8).

Figure 9:
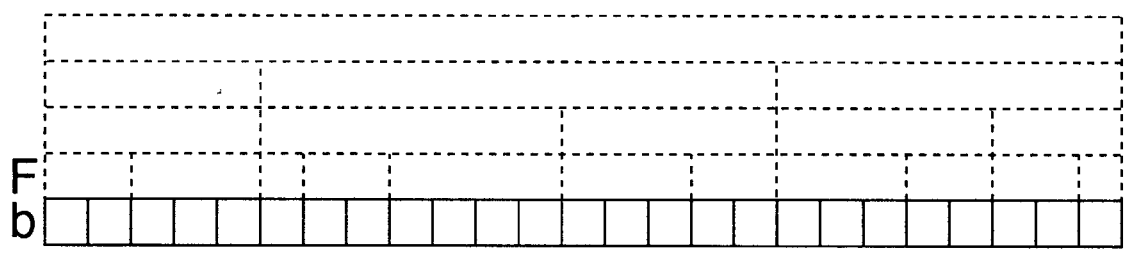
FIG. 9 shows how subblocks can be organized into a hierarchy. Such a hierarchy can be constructed by progressively restricting a constraint F.
Figure 10:
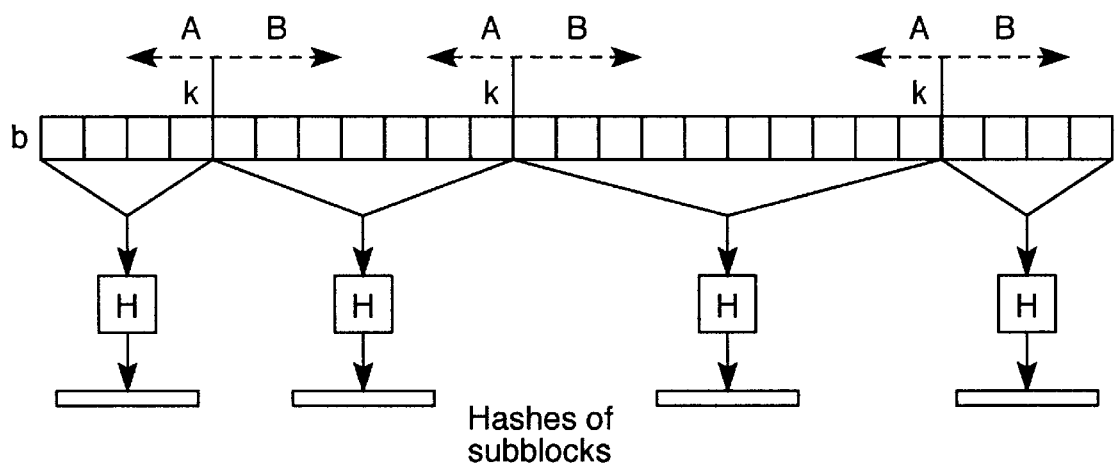
FIG. 10 depicts a method (and apparatus) for the partitioning of a block b into subblocks using a constraint F, and the calculation of the hashes of the subblocks using hash function H.
Figure 11:
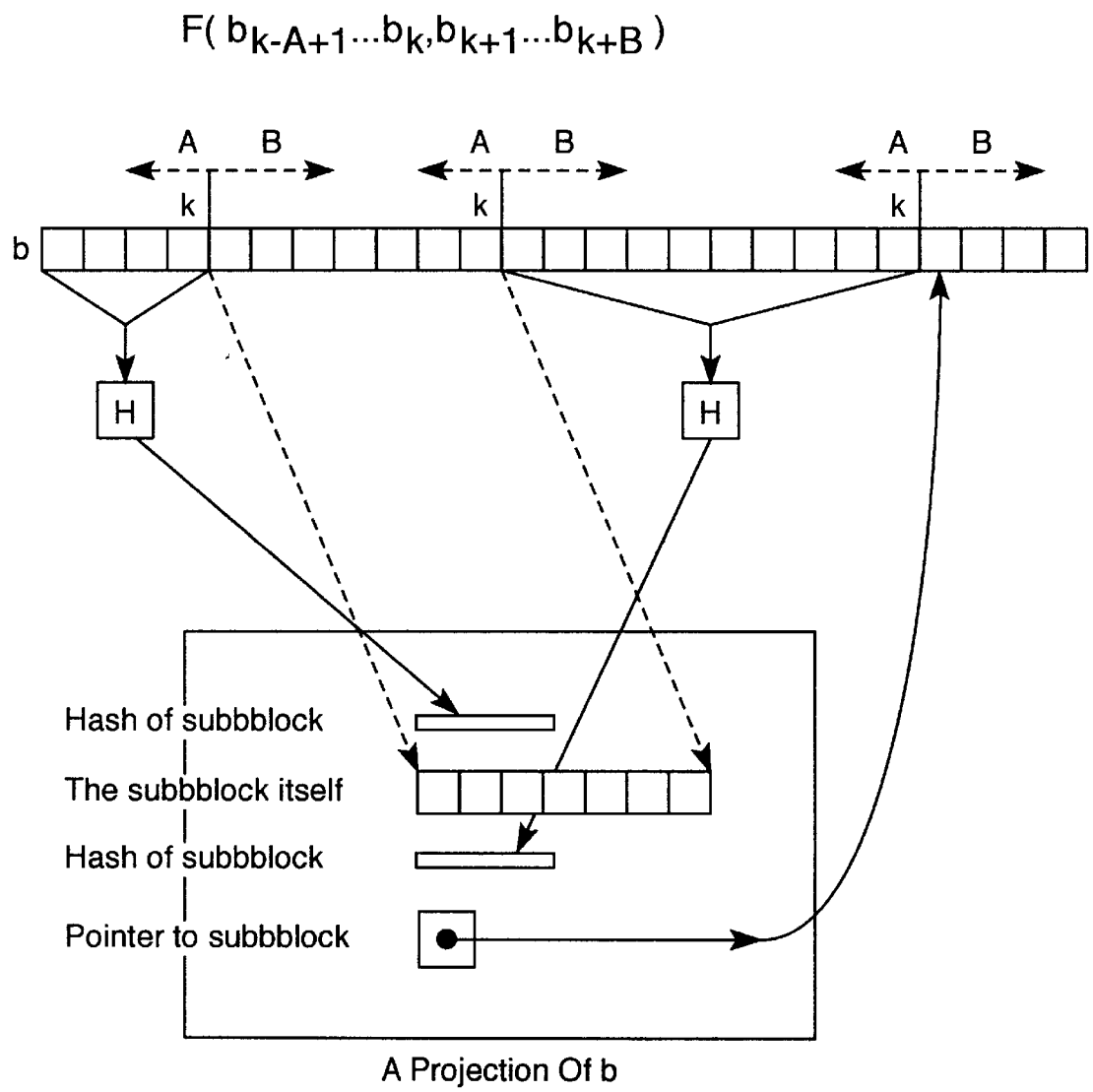
FIG. 11 depicts the partitioning of a block b into subblocks using a constraint F, and the projection of those subblocks into a structure consisting of subblock hashes, subblock data, and subblock references.
Figure 12:
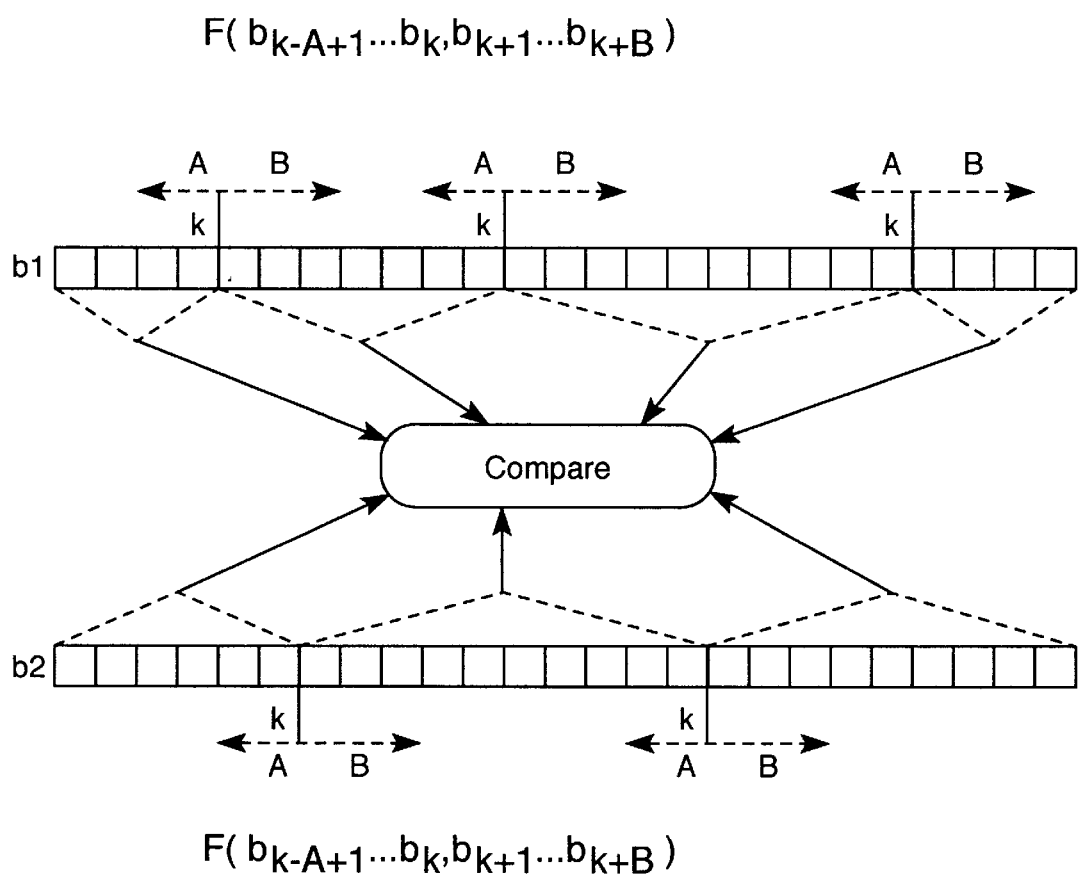
FIG. 12 depicts a method (and apparatus) for partitioning two blocks b1 and b2 into subblocks, using a constraint F, and then comparing the subblocks.
Figure 13:
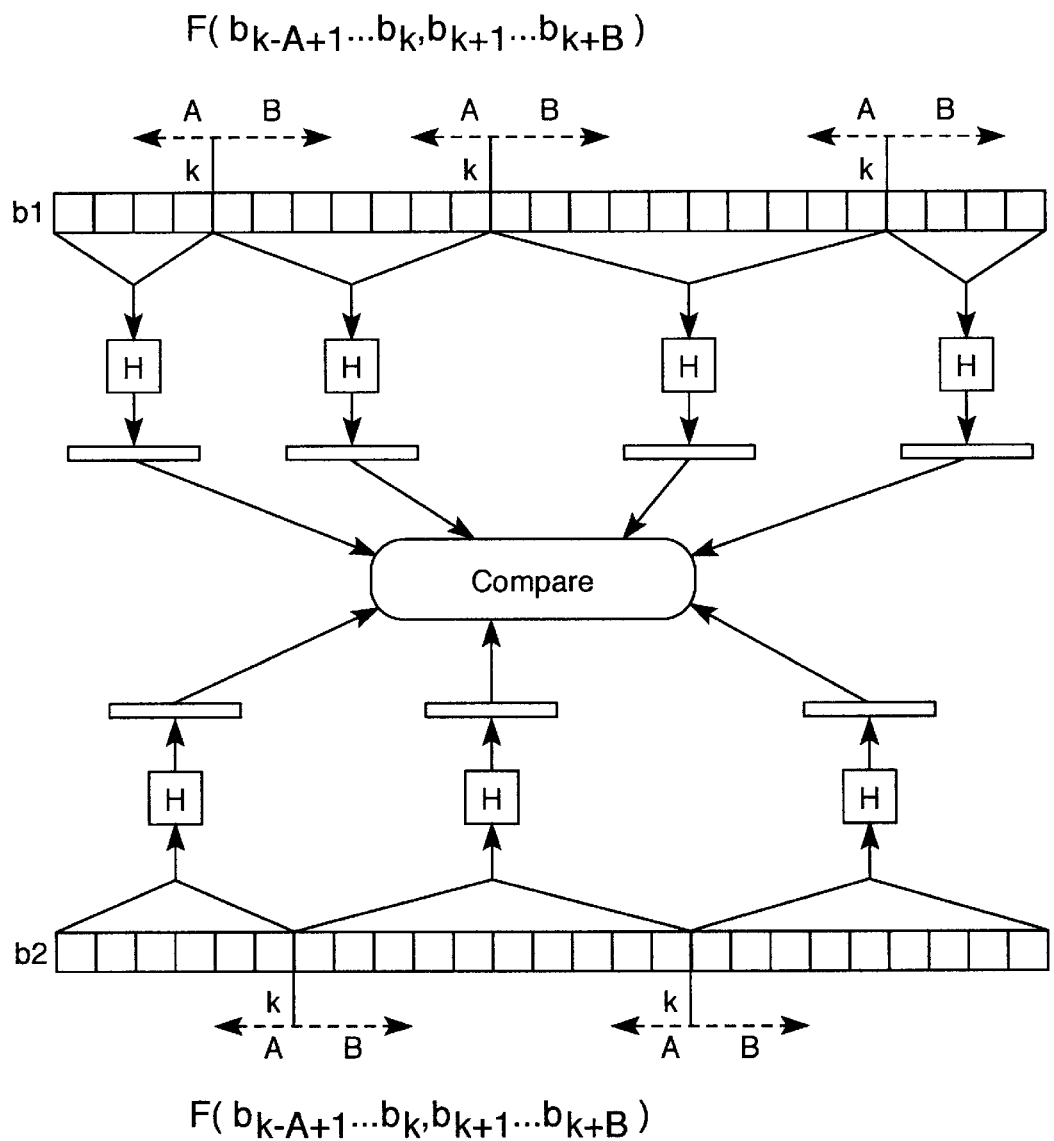
FIG. 13 depicts a method (and apparatus) for the partitioning using a constraint F, of two blocks b1 and b2 into subblocks, the calculation of the hashes of the subblocks using H, and the comparison of those hashes with each other to determine (among other things) subblocks common to both b1 and b2.
Figure 14:
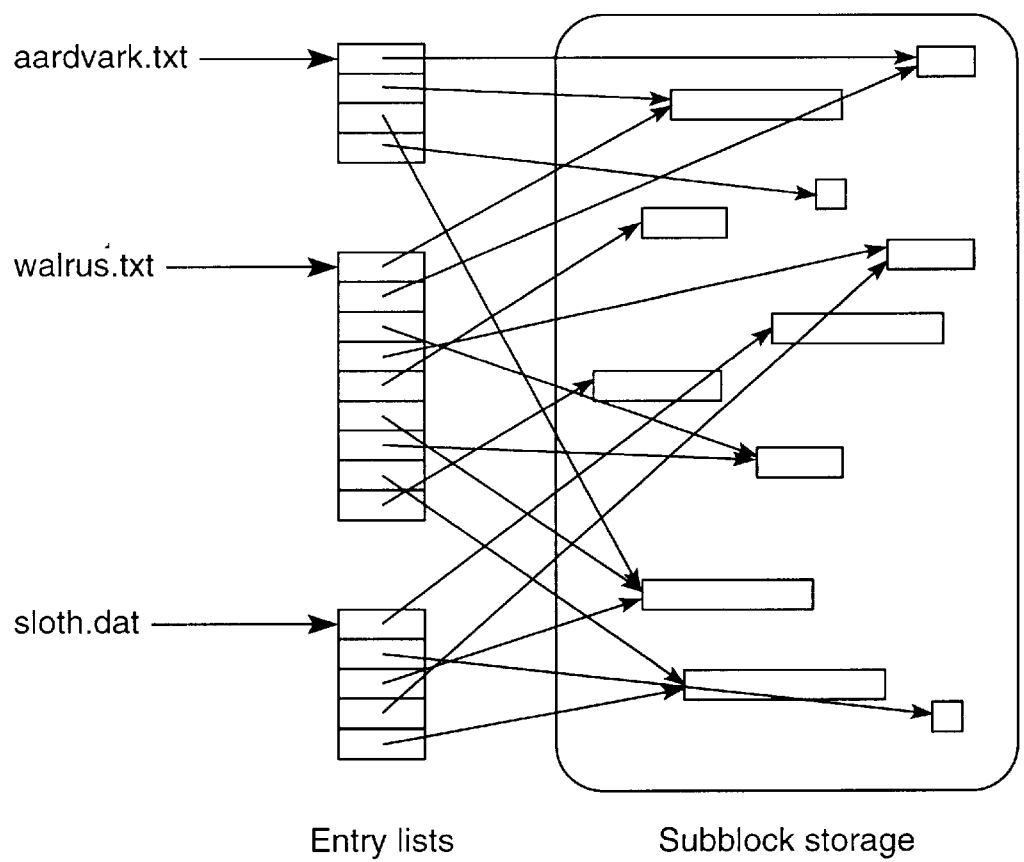
FIG. 14 depicts a method (and apparatus) for a file system that employs an aspect of the invention to eliminate the multiple storage of subblocks common to more than one file (or to different parts of the same file).
Figure 15:
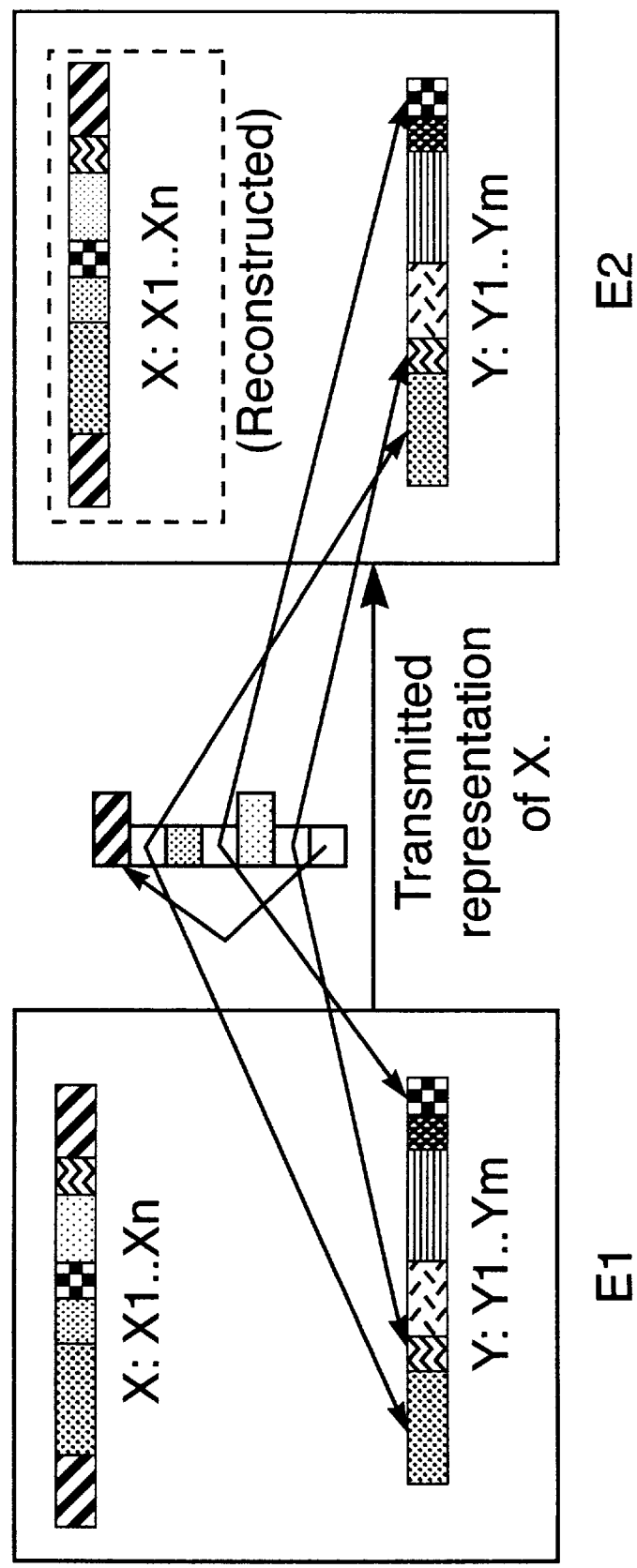
FIG. 15 depicts a method (and apparatus) for the communication of a block X from E1 to E2 where both E1 and E2 possess Y.
Figure 16:
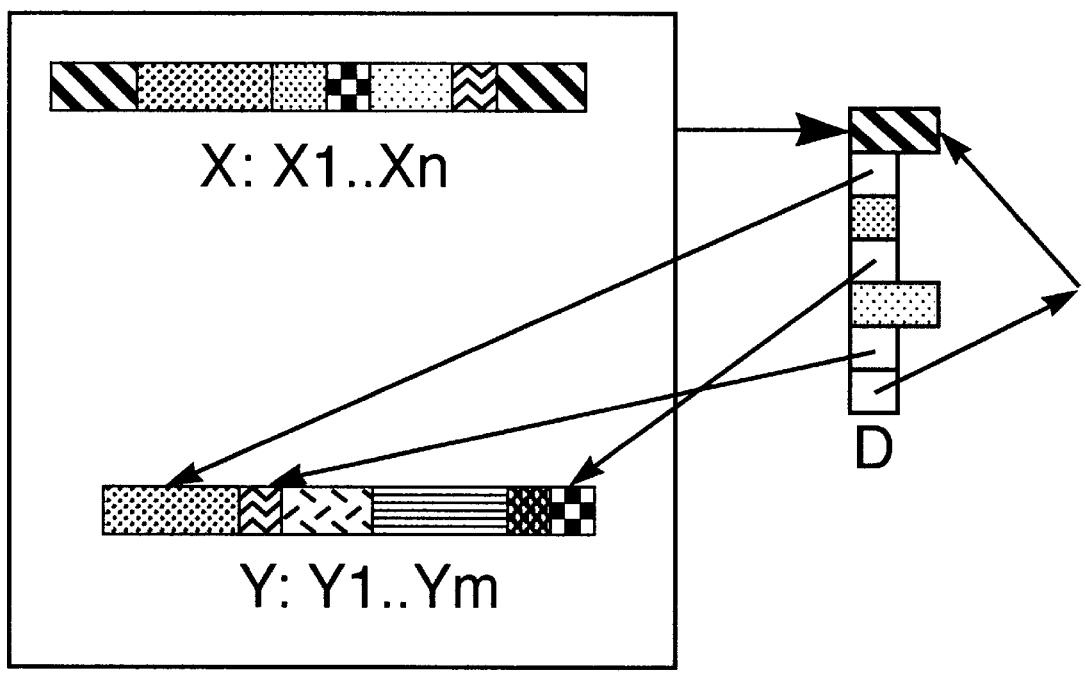
FIG. 16 depicts a method (and apparatus) for the construction of a block D from which X may be later reconstructed, given Y.
Figure 17:
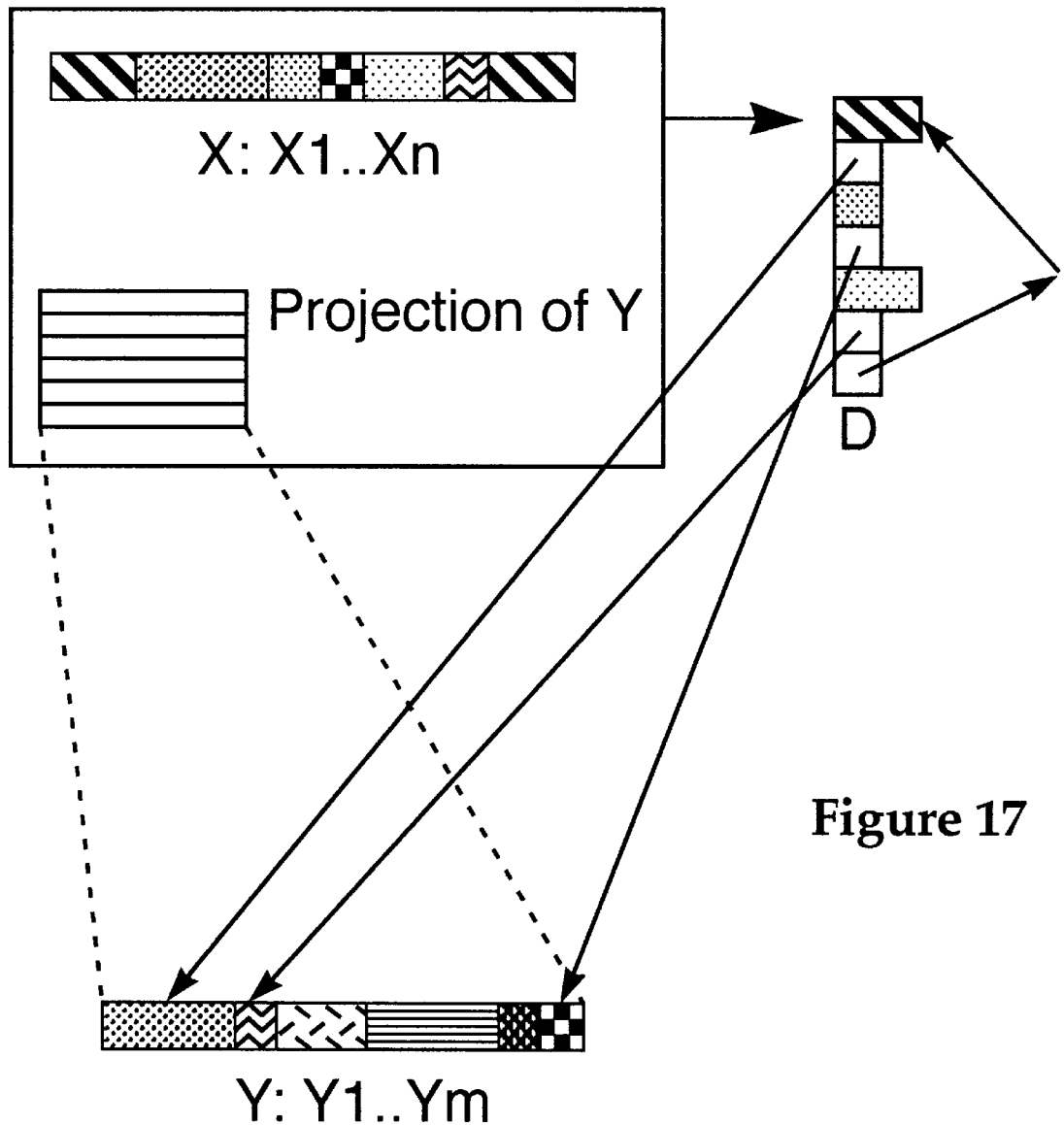
FIG. 17 depicts a method (and apparatus) for the construction of a block D from which X may be later reconstructed, given Y. In this case, the entity constructing D does not have access to Y, only to a projection of Y (being perhaps the hashes of the subblocks of Y).
Figure 18:
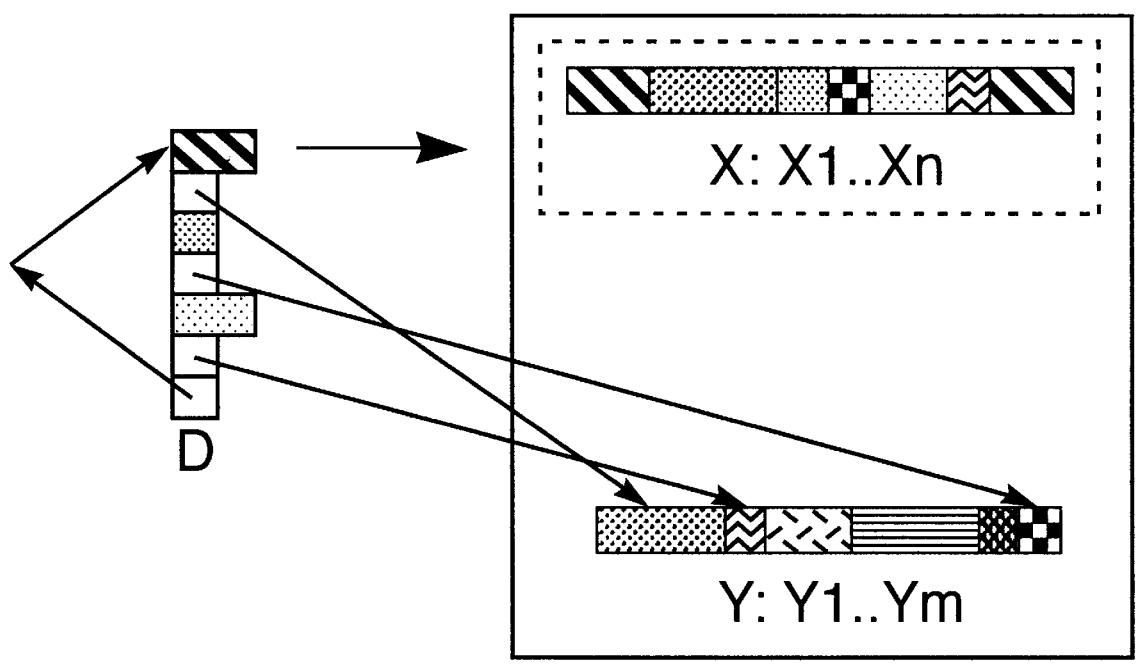
FIG. 18 depicts a method (and apparatus) for the reconstruction of X from the blocks Y and D.
Figure 19:
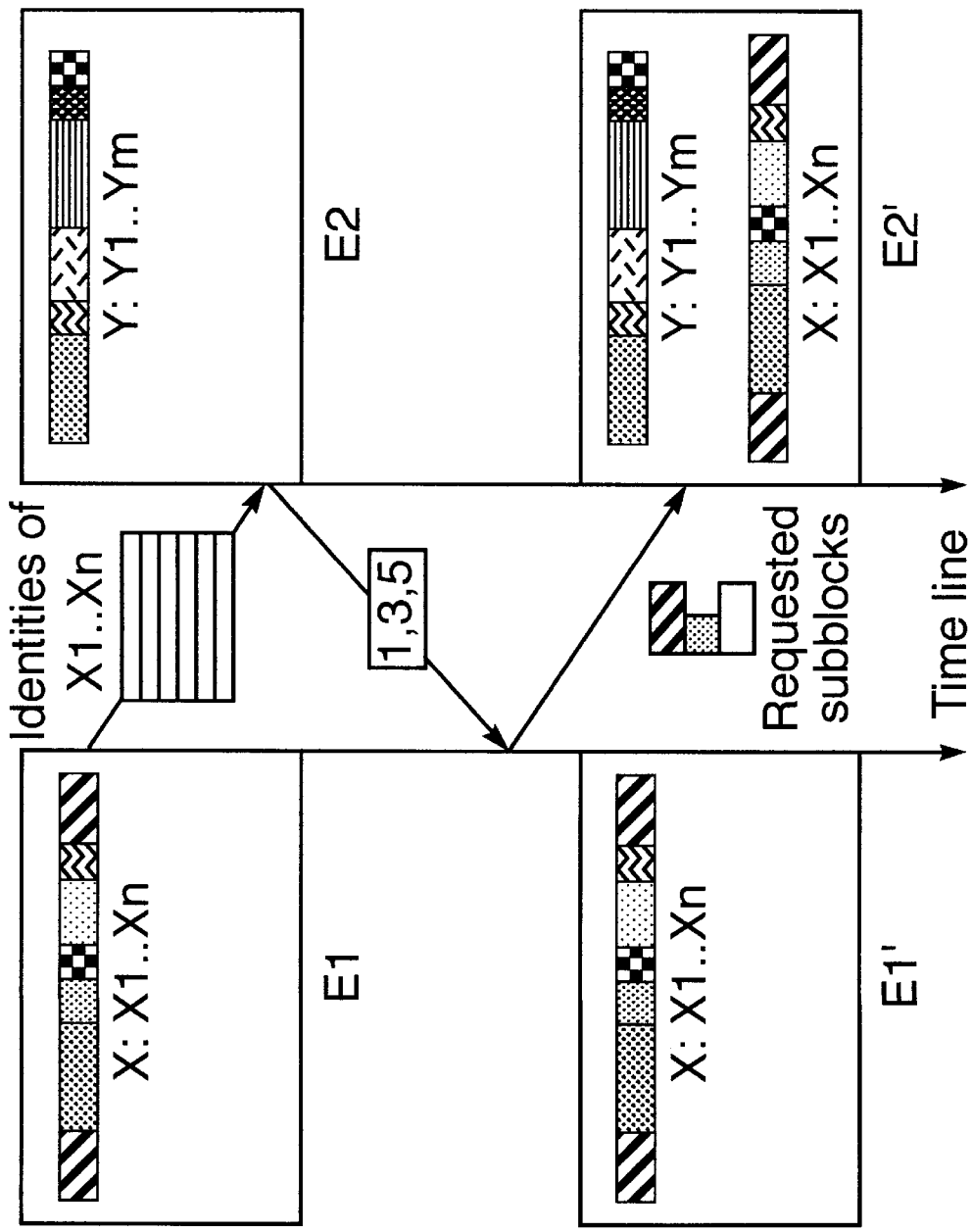
FIG. 19 depicts a method (and apparatus (E1 and E2 at each time)) for the communication of a block X from entity E2 where E2 already possesses Y.
Figure 20:
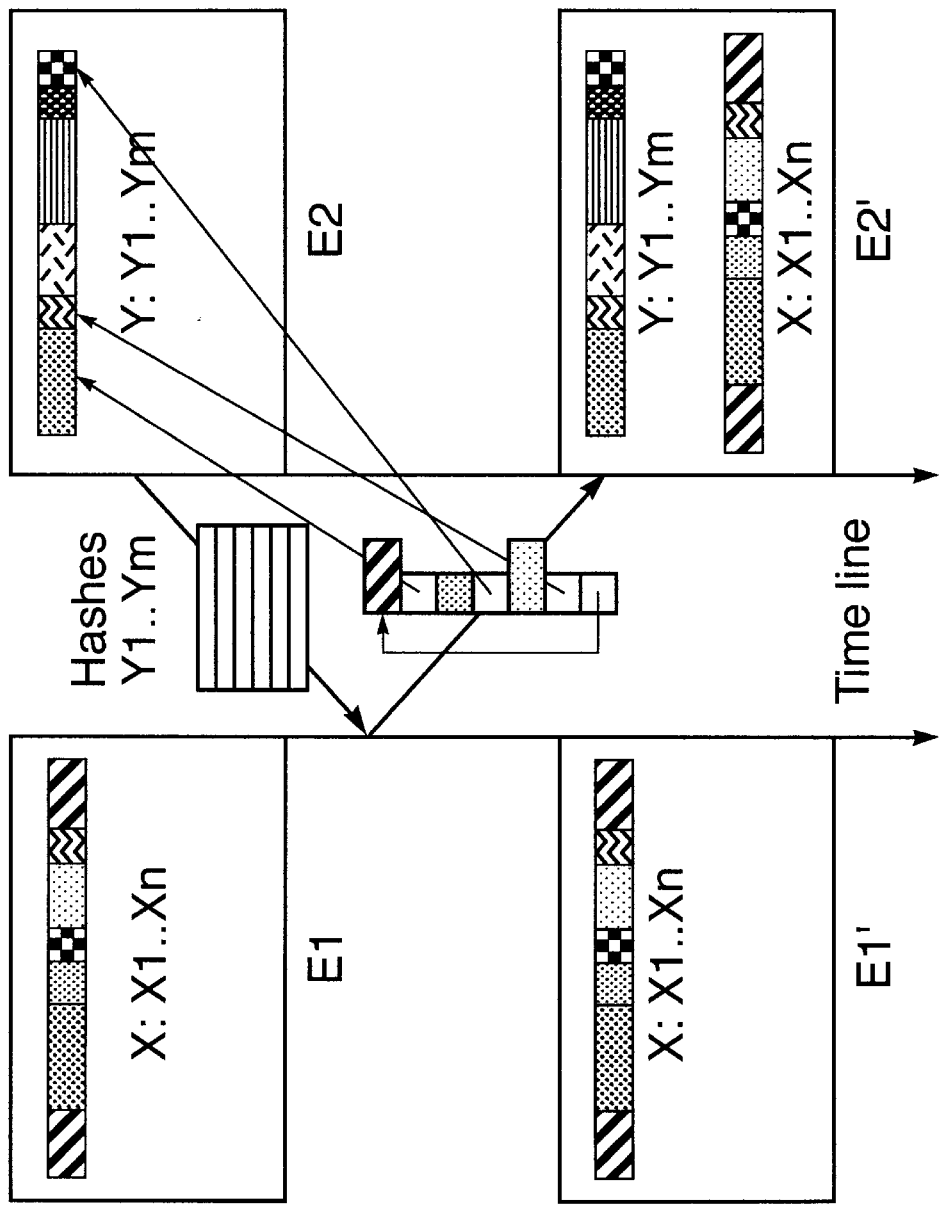
FIG. 20 depicts a method (and apparatus (E1 and E2 at each time)) for the communication of a block X from entity E1 to entity E2 where E2 already possesses Y and where E2 first discloses to E1 information about Y.
Figure 21:
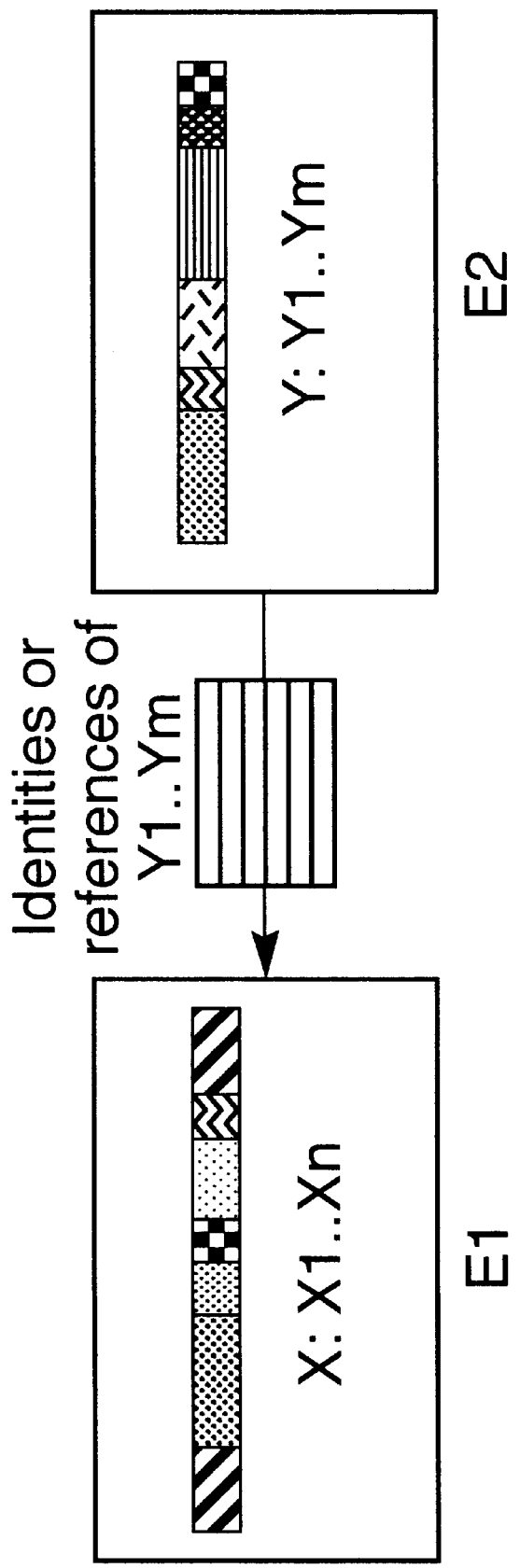
FIG. 21 depicts a method (and apparatus) for the communication, from entity E2 to entity E1, information about a block (or group of subblocks) Y at E2.
Figure 22:
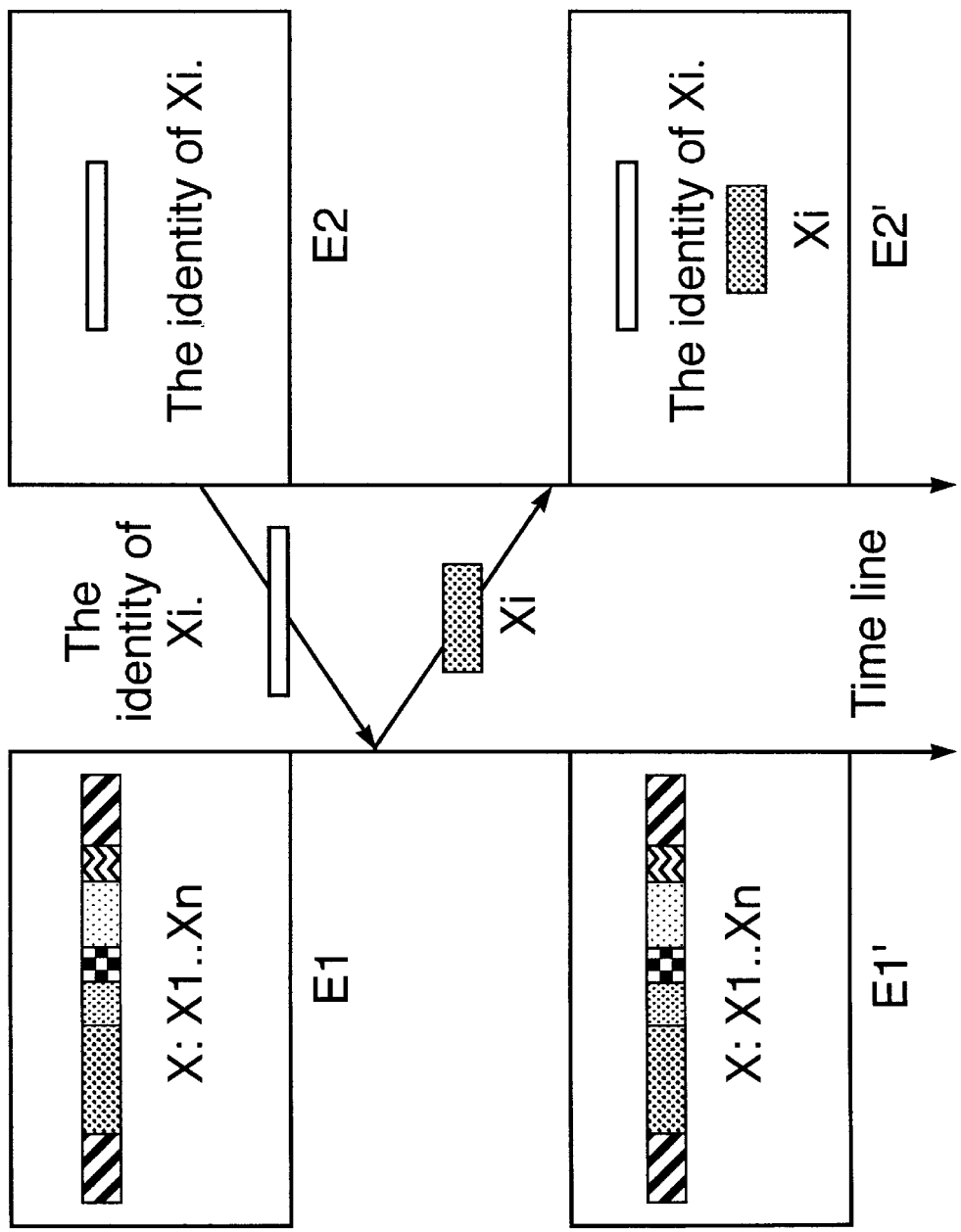
FIG. 22 depicts a method (and apparatus (E1 and E2 at each time)) for the communication from entity E1 to entity E2 of subblock $X_i$ following a request by entity E2 for the subblock $X_i$.
Figure 23:
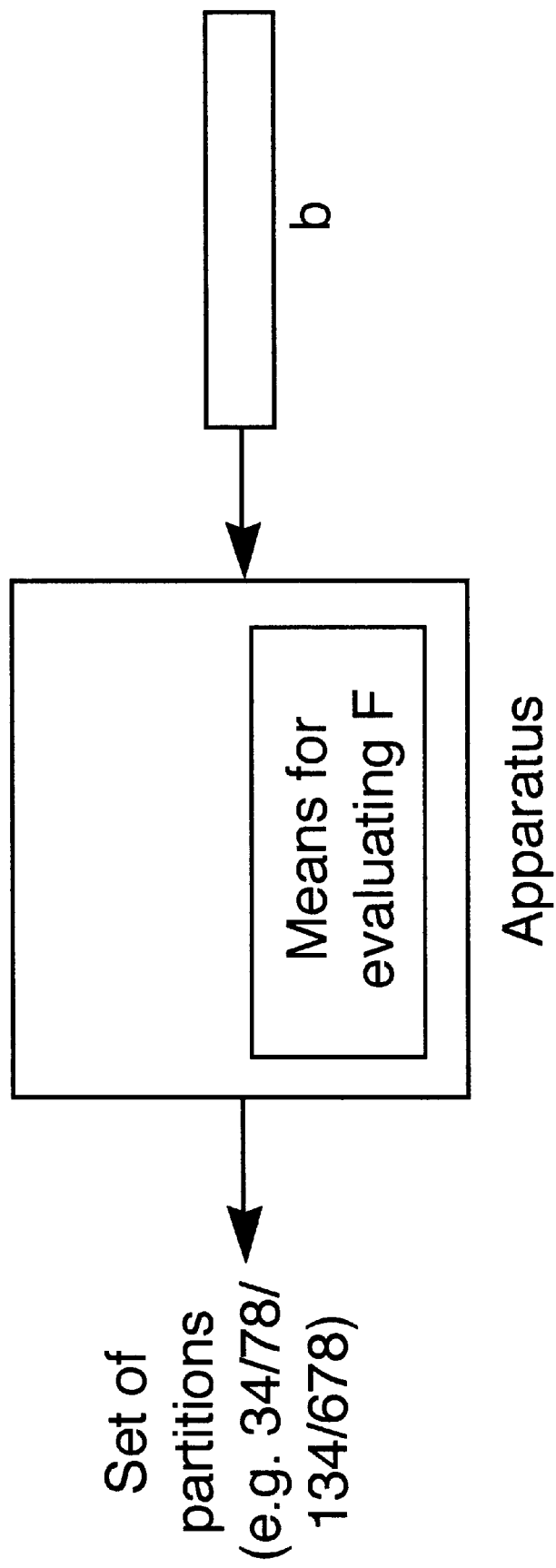
FIG. 23 depicts an apparatus for partitioning a block b (the input) using a constraint F. The output is a set of subblock boundary positions.

The efficiency of such a scheme could be improved by performing the partitioning all in one operation using increasing constraints on a single F. For example, one could use the example hash function described earlier, but use different values of the constant $\rho$ to determine the different levels of subdivision. By choosing appropriately related values of $\rho$, the set of boundaries that could be produced by the different F could be arranged to be subsets of each other, resulting in a tree structure of subblocks. For example, values of $\rho$ of 32, 64, and 128, and 256 could be used. FIG. 9 shows how the subblocks of four levels of the tree could relate to each other:

A further method could define the hash of a larger block to be the hash of the hashes of its component blocks.

Multiple partitionings could also be useful simply to provide a wider pool of subblocks to compare. For example, it may be appropriate to partition each block of data in W different ways using W different functions $F_1 \ldots F_W$ where each function yields roughly the same subblock sizes, but at different positions within the block.

Another technique would be to create an additional set of boundaries based on the boundaries provided by a hash function. For example, a fractal algorithm could be used to partition a block based upon some other partitioning provided by a function F.

Comparing Subblocks

In most applications of this invention, there will be a need at some stage to identify identical subblocks. This can be done in a variety of ways:

Compare the subblocks themselves.

Compare the hashes of the subblocks.

Compare identifies of the subblocks.

Compare references to the subblocks.

In most cases, the problem reduces to that of taking a group of subblocks of data and finding all subsets of identical subblocks. This is a well-solved problem and discussion of various solutions can be found in the following books:

Knuth D. E., "The Art of Computer Programming: Volume 1: Fundamental Algorithms". Addison Wesley, 1973.

Knuth D. E., "The Art of Computer Programming: Volume 3: Sorting and Searching", Addison Wesley, 1973.

In most cases, the problem is best solved by creating a data structure that maintains the subblocks, or references to the subblocks, in sorted order, and then inserts each subblock one at a time into the data structure. Not only does this identify all currently identical subblocks, but it also establishes a structure that can be used to determine quickly whether incoming subblocks are identical to any of those already held. The following data structures are described in the books referenced above and provide just a sample of the structures that could be used:

Hash tables.

Sorted trees (binary, N-ary, AVL).

Sorted linked lists.

Sorted arrays.

Of the multitude of solutions to the problem of matching blocks of data, one solution is worthy of special attention: the hash table. Hash tables consist of a (usually) finite array of slots into which values may be inserted. To add a value to a hash table, the value is hashed (using a hash function that is usually selected from the class of narrow hash functions) into a slot number, and the value is inserted into that slot. Later, the value can be retrieved in the same manner. Provisions must be made for the case where two data values, to be stored in the same table, hash to the same slot number.

Hash tables are likely to be of particular value in the implementation of this invention because:

They provide very fast (essentially constant time) access.

Many applications will need to calculate a strong one-way hash of each subblock, and a portion of this value can be used to index the hash table.

Particularly effective would be a hash table indexed by a portion of a strong one-way hash of the subblocks it stores, with each table entry containing (a) the strong one-way hash of the subblock, and (b) a pointer to the subblock stored elsewhere in memory.

The Use of Compression, Encryption, and Integrity Techniques

Aspects of the invention could be enhanced by the use of data compression, data encryption, and data integrity techniques. The applications of these techniques include, but are not limited to, the following applications:

Any subblock that is transmitted or represented in its raw form could alternatively be transmitted or represented in a compressed or encrypted form.

Subblocks could be compressed and encrypted before further processing by aspects of this invention.

Blocks could be compressed and encrypted before further processing by aspects of this invention.

Communications or representations could be compressed or encrypted.

Any component could carry additional checking information such as checksums or digests of the data in the component.

Ad-hoc data compression techniques could be used to further compress references and identities or consecutive runs of references and identities.

Storage of Variable-Length Subblocks on Disk

The division of data into subblocks of varying length presents some storage organization problems (if the subblocks are to be stored independently of each other), as most hardware disk systems are organized to store an array of fixed-length blocks (e.g. one million 512-byte blocks) rather than variable-length ones. Here are some techniques that could be used to tackle this problem:

Each subblock could be stored in an integral number of disk blocks, with some part of the last disk block being wasted. For randomly sized subblocks, this scheme will waste on average half a disk block per subblock.

Create a small subset of different bucket sizes (e.g. powers of two) and create arrays on the disk that pack collections of these buckets efficiently into the disk blocks. For example, if disk blocks were 512 bytes long, one could fairly efficiently pack five 200-byte buckets into an array of two disk blocks. Each subblock would be stored in the smallest bucket size that would hold the subblock, with the unused part of the bucket being wasted.

Treat the disk blocks as a vast array of bytes, and use well-established heap management techniques to manage the array. A sample of such techniques appears in pages 435–451 of the book:

Knuth D. E., "The Art of Computer Programming: Volume 1: Fundamental Algorithms", Addison Wesley, 1973.

The Use of Concurrency

Two processes are said to be concurrent if their execution takes place in some sense at the same time:

In interleaving concurrency, some or all of the operations performed by the two processes are interleaved in time, but the two processes are never both executing at exactly the same instant.

In genuine concurrency, some or all of the operations performed by the two processes are genuinely executed at the same instant. Implementations of the present invention could incorporate either form of concurrency to various degrees. In most of the aspects of the invention, some subset of the steps of each aspect could be performed concurrently. In particular (without limitation):

A block could be split into parts and the parts partitioned concurrently.

The processing of subblocks defined during a sequential partitioning of a block need not be deferred until the entire block has been partitioned. In particular, the hashes of already-defined subblocks could be calculated and compared while further subblocks are being defined.

Communicating entities that decompose and compose blocks could execute concurrently.

Where more than one block must be partitioned for processing, such partitioning could be performed concurrently.

Many more forms of concurrency within aspects of this invention could be identified.

Example: Partitioning a Block

We now present a simple example of how a block might be partitioned in practice. Consider the following block of bytes:

$b_1\ b_2\ b_3\ b_4\ b_5\ b_6\ b_7\ b_8\ b_9\ \ldots$

In this example, an example hash function H will be used to partition the block. Boundaries will be represented by pairs such as $B_6|b_7$. We will assume that H returns a boolean value based on its argument and that a boundary is to be placed at each $b_i|b_i+1$ for which $H(b_i-2, b_i-1, b_i)$ evaluates to true.

As the hash function accepts 3 byte arguments, we start at $b_3|b_4$ and evaluate $H(b_1, b_2, b_3)$. This turns out to be false (for the purposes of example), so we move to $b_4|b_5$ and evaluate $H(b_2, b_3, b_4)$. This turns out to be true, so a boundary is placed at $b_4|b_5$. Next, we move to $b_5|b_6$ and evaluate $H(b_3, b_4, b_5)$. This turns out to be false so we move on. $H(b_4, b_5, b_6)$ is true so we place a boundary at $b_6|b_7$. This process continues until the end of the block is reached.

$b_1\ b_2\ b_3\ b_4\ |\ b_5\ b_6\ |\ b_7\ b_8\ b_9\ \ldots$

Some variations on this approach are:

Imposition of a lower bound L on subblock size by skipping ahead L bytes after placing a boundary.

Imposition of an upper bound U on block size by artificially placing a boundary if U bytes have been processed since the last boundary was placed.

Improving the efficiency of the hash calculations by using some part of the calculation of the has of the bytes at one position to calculate the hash at the next position. For example, it may be more efficient to calculate $H(x,y,z)$ if $H(*,x,y)$ has already been calculated. For example, the Internet IP checksum is organized so that a single running checksum value can be maintained, with bytes entering the window being added to the checksum, and bytes exiting the window being subtracted from the checksum.

Applying this algorithm in reverse, starting from the end of the block and working backwards.

Finding the subblock that encloses a particular point (chosen from anywhere within the block) by exploring in both directions from the point, looking for the nearest boundary in each direction.

Finding all subblock boundaries in one step of evaluating F for all position concurrently.

Example: Forming a Table of Hashes

Figure 24:
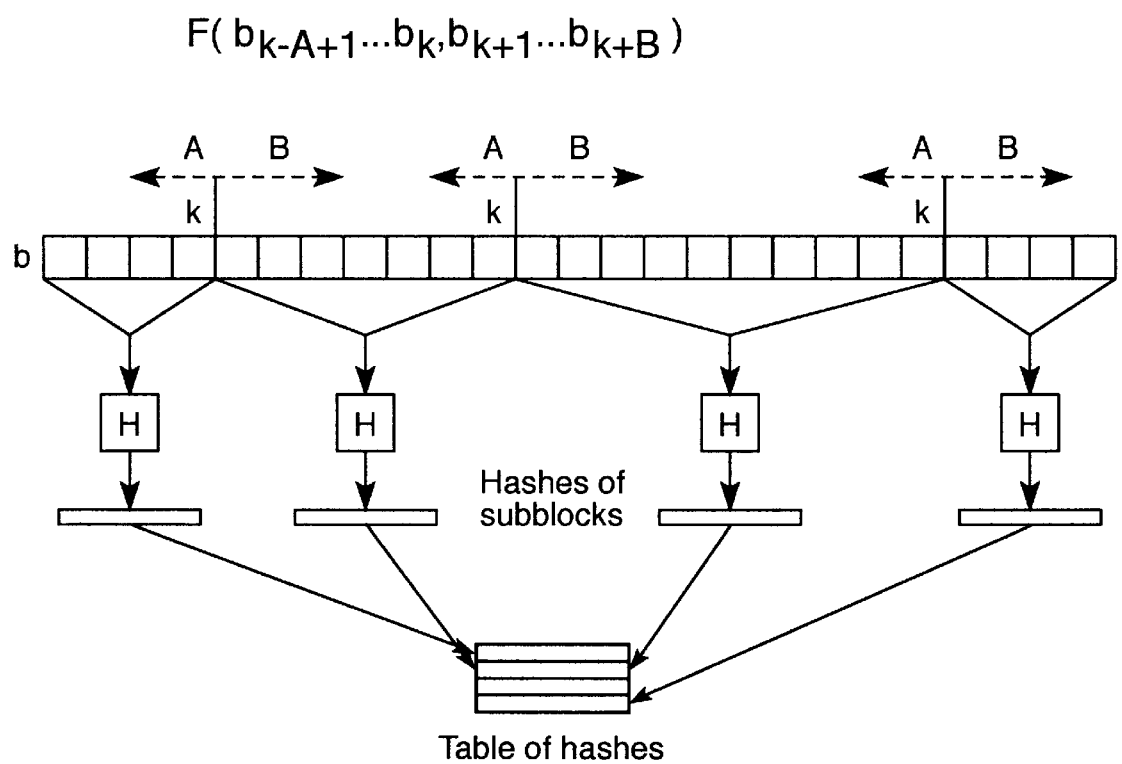
FIG. 24 depicts a method (and apparatus) for the partitioning of a block b into subblocks using constraint F, and the projection of those subblocks into a table of subblock hashes.

Once a block has been partitioned, the hash of each subblock can be calculated to form a table of hashes (FIG. 24).

This table of hashes can be used to determine if a new subblock is identical to any of the subblocks whose hashes are in the table. To do this, the new subblock's hash is calculated and a check made to see if the hash is in the table.

In FIG. 24, the table of hashes looks like an array of hashes. However, the table of hashes could be stored in a wide variety of data structures (e.g. hash tables, binary trees).

Example Application: A File Comparison Utility

As the invention provides a new way of finding similarities between large volumes of data, it follows that it should find some application in the comparison of data.

In one aspect, the invention could be used to determine the broad similarities between two files being compared by a file comparison utility. The utility would partition each of the two files into subblocks, organize the hashes of the subblocks somehow (e.g. using a hash table) to identify all identical subblocks, and then use this information as a framework for reporting similarities and differences between the two files.

In a similar aspect, the invention could be used to find similarities between the contents of large numbers of files in a file system. A utility incorporating the invention could read each file in an entire file system, partition each into subblocks and then insert the subblocks (or hashes of the subblocks) into one huge table (e.g. implemented by a hash table or a binary tree). If each entry in the table carried the name of the file containing it as well as the position of the subblock within the file, the table could later be used to identify those files containing identical portions of data.

If, in addition, a facility was added for recording and comparing the hashes of the entire contents of files and directory trees, a utility could be constructed that could identify all largely similar structures within a file system. Such a utility would be immensely useful when (say) attempting to merge the data on several similar backup tapes.

Example Application: A Fine-Grained Incremental Backup System

In a fine-grained incremental backup system, two entities E1 and E2 (e.g. two computers on a network) wish to repeatedly backup a file X at E1 such that the old version of the file Y at E2 will be updated to become a copy of the new version of the file X at E1 (without modifying X). The system could work as follows.

Each time E1 performs a backup operation, it partitions X into subblocks and writes the hashes of the subblocks to a shadow file S. It might also write a hash of the entire contents of X to the shadow file. After the backup has been completed, X will be the same as Y and so the shadow file S will correspond to both X and Y. Once X is again modified (during the normal operation of the computer system), S will correspond only to Y. S can then be used during the next backup operation.

To perform the backup, E1 compares the hash of Y (stored in S) against the hash of X to see if X has changed (it could also use the modification date file attribute of the file). If X hasn't changed, there is no need to perform any further backup action. If X has changed, E1 partitions X into subblocks, and compares the hashes of these subblocks with the hashes in the shadow file S, so as to find all identical hashes. Identical hashes identify identical subblocks in Y that can be transmitted by reference. E1 then transmits the file as a mixture of raw subblocks and references to subblocks whose hashes appear in S and which are therefore known to appear as subblocks in Y. E1 can also transmit references to subblocks already transmitted. References can take many forms including (without limitation):

A hash of the subblock.
The number of the subblock in the list of subblocks in Y.
The number of a subblock previously transmitted.
A range of any of the above.

Figure 25:
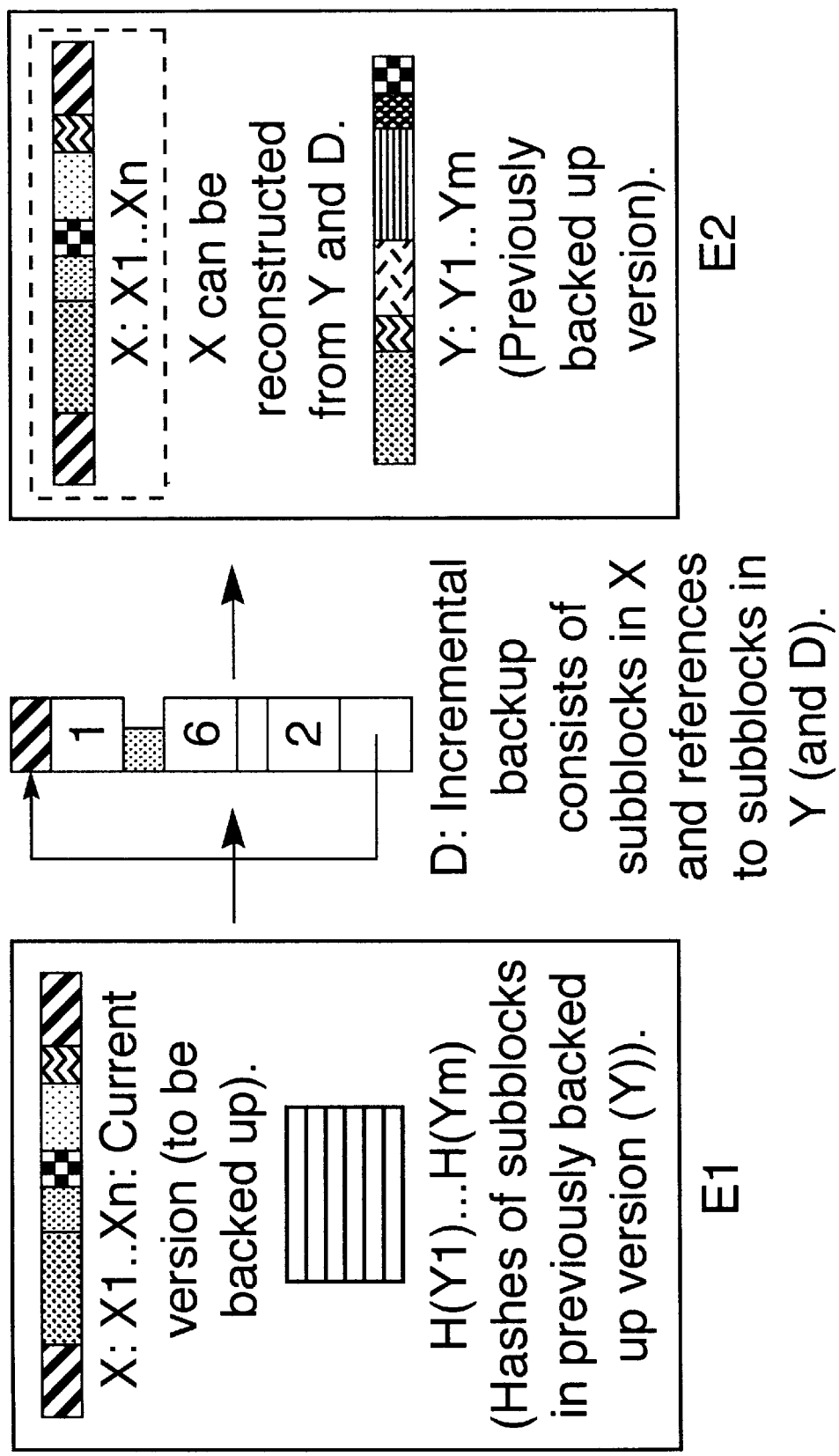
FIG. 25 depicts a method (and apparatus) for the transmission from entity E1 to E2 of a block X where E2 possesses Y and E1 possesses a table of the hashes of the subblocks of Y (a projection of Y).

Throughout this process, E1 can be constructing the new shadow file corresponding to X. FIG. 25 illustrates the backup process.

To reconstruct X from Y and D (the incremental backup information being sent from E1), E2 partitions Y into subblocks said calculates the hashes of the subblocks (It could do this in advance during the previous backup). It then processes the incremental backup information, copying subblocks that were transmitted raw and looking up the references either in Y or in the part of X already reconstructed.

Because information need only flow from E1 to E2 during the backup operation, there is no need for E1 and E2 to perform the backup operation concurrently. E1 can perform its side of the backup operation in isolation, producing an incremental backup file that can be later processed by E2.

There is a tradeoff between 1) the approximate ratio between the size of each file and that of its shadow, and 2) the mean subblock size. The higher the mean subblock size (as determined by the partitioning method used), the fewer subblocks per unit file length, and hence the shorter the shadow size per unit file length. However, increasing means subblock sizes implies increasing the granularity of backups which can cause an increase in the size of the incremental backup file. There is also a tradeoff between the shadow file size and the hash width. A shadow file that uses 128-bit hashes will be about twice as long as one that uses 64-bit hashes. All these tradeoffs must be considered closely when choosing an implementation.

| Bytes | Description |
| --- | --- |
| 16 | MD5 digest of the file Y corresponding to this shadow file. |
| 16 | MD5 digest of the first subblock in Y. |
| 16 | MD5 digest of the second subblock in Y. |
| .. | ... |
| 16 | MD5 digest of the last subblock in Y. |
| 16 | MD5 digest of the rest of this shadow file. |

The first field contains the MD5 digest (a form of cryptographic hash) of the entire contents of Y. This is included so that it can be copied to the incremental backup file so as to provide a check later that the incremental backup file is not being applied to the wrong version of Y. It could also be used to determine if any change has been made to X since the previous backup Y was taken. The first field is followed by a list of the MD5 digests of the subblocks in Y in the order in which they appear in Y. Finally, a digest of the contents of the shadow file (less this field) is included at the end so as to enable the detection of any corruption of the shadow file.

The format of the incremental backup file is as follows:

| Bytes | Description |
| --- | --- |
| 16 | MD5 digest of Y. |
| 16 | MD5 digest of X. |
| .. | Zero or more ITEMS. |
| 16 | MD5 digest of the rest of the incremental backup file. |

The first two fields of the incremental backup file contain the MD5 digest of the old and new versions of the file. The hash of the new version X is calculated directly from X. The hash of the old version is obtained from the first field of the shadow file. These two values enable the remote backup entity E2 to check that:

The backup file Y (to be updated) is identical to the one from which the shadow file was generated.
The reconstructed X is identical to the original X.

The two checking fields are followed by a list of items followed by a checking digest of the rest of the incremental backup file.

Each item in the list of items describes one or more subblocks in the list of subblocks that can be considered to constitute X. There are three kinds of item, and each item commences with a byte having a value one, two, or three to indicate the kind of item. Here is a description of the content of each of the three kinds of item:

1. The 32-bit index of s subblock in Y. Because E2 possesses Y, it can partition Y itself to construct the same partitioning that was used to create the shadow file. Thus E1 doesn't need to send the hash of any subblock that is in both X and Y. Instead, it need only send the index of the subblock in the list of subblocks constituting Y. This list is represented by the list of hashes in the shadow file S. As 32-bits is wide enough for an index in practice, the saving gained by communicating a 32-bit index instead of a hash is 98 bits for each such item.
2. A pair of 32-bit numbers being the index of the first and last subblock of a range of subblocks in Y. Old and new versions of files often share large contiguous ranges of subblocks. The use of this kind of item allows such ranges to be represented using just 64 bits instead of a long run of instances of the first kind of item.
3. A 32-bit value containing the number of bytes in the subblock, followed by the raw content of the subblock. This kind of item is used if the subblock to be transmitted is not present in Y.

In the implementation, all the values are coded in little-endian form. Big-endian could be used equally as well.

The existing implementation could be further optimized by (without limitation):

Adding an additional kind of item that refers to subblocks in X already transmitted;

Adding an additional kind of item that refers to ranges of subblocks in X already transmitted;

Employing data compression techniques to compress the raw blocks in the third kind of item.

Using the first hash in the shadow file to check to see if the entire file has changed at all before performing the backup process described above.

Replacing hashes in S of subblocks in Y by references to other hashes in S (where the hashes (and hence subblocks) are identical). Repeated runs of hashes could also be replaced by pointers to ranges of hashes.

The scheme described above has been described in terms of a single file. However, the technique could be applied repeatedly to each of the files in a file system, thus providing a way to back up an entire file system. The shadow information for each file in the file system could be stored inside a separate shadow file for each file, or in a master shadow file containing the shadows for one or more (or all) files in the file system.

Although most redundancy in a file system is likely to be found within different versions of each file, there may be great similarities between versions of different files. For example, if a file is renamed, the "new" file will be identical to the "old" file. Such redundancy can e catered for by comparing the hashes of all the files in the old and new versions of a file system. In addition, similarities between different parts of different files can be exploited by comparing the hashes of subblocks of each file to be backed up with the hashes of the subblocks of the entire old version of the file system.

If E2 has lots of space, a further improvement could be for E1 to retain the shadows of all the previous versions of the file system, and for E2 to retain copies of all the previous versions of the file system. E1 could then refer to every block it has ever seen. This technique could also be applied on a file-by-file basis.

In a further variant, the dependence on the ordering of subblocks could be abandoned, and E1 could simply keep a shadow file containing a list of the hashes of all the subblocks in the previous version (or versions) of the file or file system. E2 would then need to record only a single copy of each unique subblock it has ever received from E1.

Aspects of the backup application described in this section can be integrated cleanly into existing backup architecture by deploying the new mechanisms within the framework of existing ones. For example, the traditional methods for determining if a file has changed since the last backup (modification date, backup date and so on) can be used to see if a file needs to be backed up at all, before applying the new mechanisms.

Example Application: A Low-Redundancy File System

Figure 26:
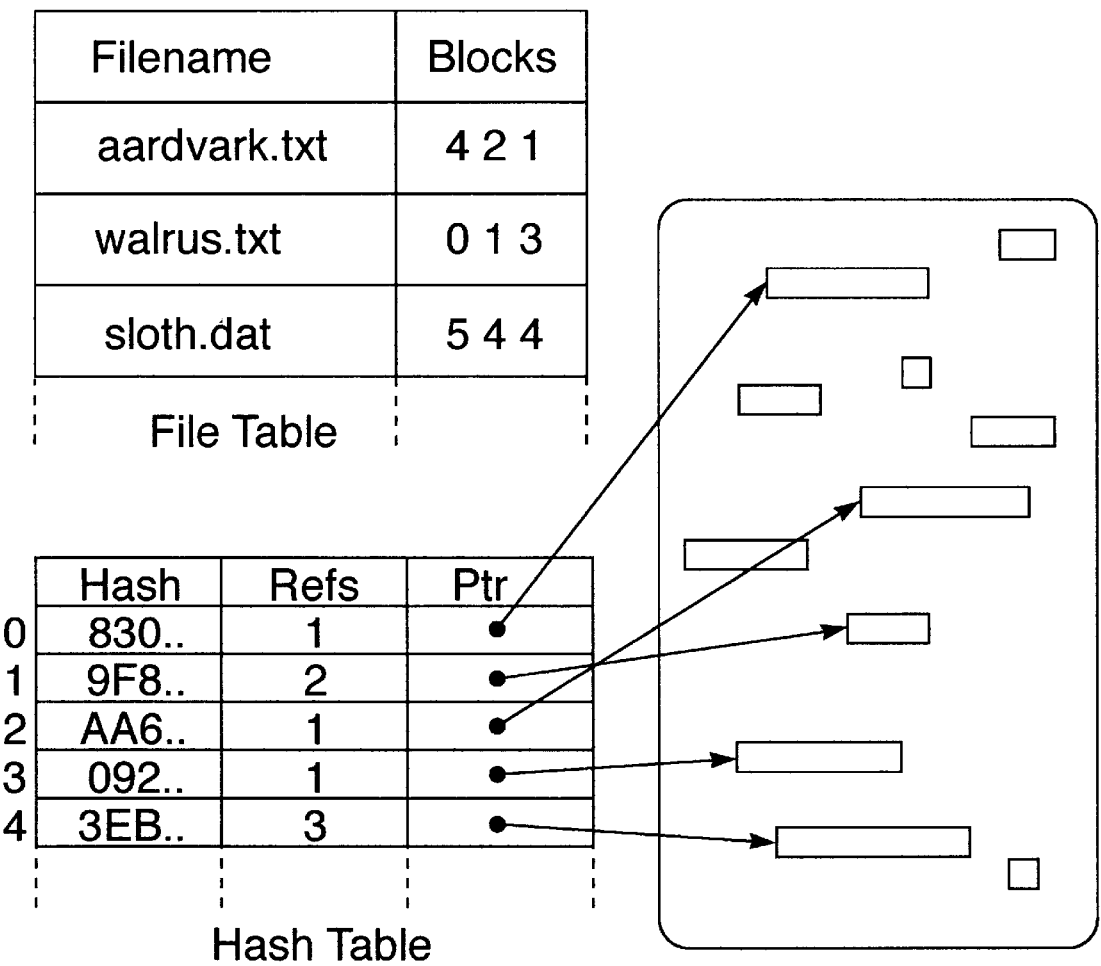
FIG. 26 depicts a method (and apparatus) for a file system that employs an aspect of the invention to eliminate the multiple storage of data common to more than file (or to different parts of the same file).

We now present an example of a low-redundancy file system that attempts to avoid storing different instances of the same data more than once. In this example, the file system is organized as shown in FIG. 26.

The bottom layer consists of a collection of unique subblocks of varying length that are stored somewhere on the disk. The middle layer consists of a hash table containing one entry for each subblock. Each entry consists of a cryptographic hash of the subblock, a reference count for the subblock, and a pointer to the subblock on disk. The hash table is indexed by some part of the cryptographic hash (e.g. the bottom 16 bits). Although a hash table is used in this example, many other data structures (e.g. a binary tree) could also be used to map cryptographic hashes to subblock entries. It would also be possible to index the subblocks directly without the use of cryptographic hashes.

The top layer consists of a table of files that binds filenames to lists of subblocks, each list being a list of indexes into the hash table. The reference count of the hash table records the number of references to the subblock that appear in the entire set of files in the file table. The issue of hash table "overflow" can be addressed using a variety of well-known overflow techniques such as that of attaching a linked list to each hash slot.

When a file is read, the list of hash table indexes is converted to pointers to subblocks of data using the hash table. If random access to the file is required, extra information about the length of the subblocks could be added to the file table and/or hash table so as to speed access.

Writing a file is more complicated. During a sequential write, the data being written is buffered until a subblock-boundary is reached (as determined by whatever boundary function is being used). The cryptographic hash of the new subblock is then calculated and used to look up the hash table. If the subblock is unique (i.e. there is no entry for the cryptographic hash), it is added to the data blocks on the disk and an entry is added to the hash table. A new subblock number is added to the list of blocks in the file table. If, on the other hand, the subblock already exists, the subblock need not be written to disk. Instead, the reference count of the already-existing subblock is incremented, and the subblock's hash table index is added to the list of blocks in the file's entry in the file table.

Random access writes are more involved, but essentially the same principles apply.

If a record were kept of subblocks created since the last backup, backing up this file system could be very efficient indeed.

One enhancement that could be made is to exploit unused disk space. Instead of automatically ignoring or overwriting subblocks whose reference count has dropped to zero, the low-redundancy file system could move them to a pool of unused subblocks. These subblocks, while not present in any file, could still form part of the subblock pool referred to when checking to see if incoming subblocks are already present in the file system. The space consumed by subblocks in the unused subblock pool would be recycled only when the disk was full. In the steady state, the "unused" portion of the disk would be filled by subblocks in the unused subblock pool.

Although this section has specifically described a low-redundancy file system, this aspect of the invention is really a general purpose storage system that could be applied at many levels and in many roles in information processing systems. For example:

The technique could be used to implement a low-redundancy virtual memory system. The contents of memory could be organized as a collection of subblocks.

The technique could be used to increase the efficiency of an on-chip cache.

Example Application: A Communication System

A method is now presented for reducing redundant transmissions in communications systems. Consider two entities E1 and E2, where E1 must transfer a block of data X to E2. E1 and E2 need never have communicated previously with each other.

The conventional way to perform the transmission is simply for E1 to transmit X to E2. However, here E1 first partitions X into subblocks and calculates the hash of each subblock using a hash function. It then transmits the hashes to E2. E2 then looks up the hashes in a table of hashes of all the subblocks it already possesses. E2 then transmits to E1 information (e.g. a list of subblock numbers) identifying the subblocks in X that E2 does not already possess. E1 then transmits just those subblocks.

Another way to perform the transaction would be for E2 to first transmit to E1 the hashes of all the subblocks it possesses (or perhaps a well chosen subset of them). E1 could then transmit references to subblocks in X already known to E2 and the actual contents of subblocks in X not known to E2. This scheme could be more efficient than the earlier scheme in cases where E2 possesses less subblocks than there are in X.

Another way to perform the transaction would be for E1 and E2 to conduct a more complicated conversation to establish which subblocks E2 possesses. For example, E2 could send E1 the hashes of just some of the subblocks it possesses (perhaps the most popular ones). E1 could then send to E2 the hashes of other subblocks in X. E2 could then reply indicating which of those subblocks it truly does not possess. E1 could then send to E2 the subblocks in X not possessed by E2.

In a more sophisticated system, E1 and E2 could keep track of the hashes of the subblocks possessed by the other. If either entity ever sent (for whatever reason) a reference to a subblock not possessed by the other entity, the latter entity could simply send back a request for the subblock to be transmitted explicitly and the former entity could send the requested subblock.

The communication application described above considers the case of just two communicants. However, there is no reason why the scheme could not be generalized to cover more than two communicants communicating with each other in private and in public (using broadcasts). For example, to broadcast a block, a computer $C_1$ could broadcast a list of the hashes of the block's subblocks. Computers $C_2 \ldots C_N$ could then each reply indicating which subblocks they do not already possess. $C_1$ could then broadcast subblocks that many of the other computers do not possess, and send the subblocks missing from only a few computers to those computers privately.

All these techniques have the potential to greatly reduce the amount of information transmitted between computers.

These techniques would be very efficient if they were implemented on top of the file system described earlier, as the file system would already have performed the work of organizing all the data it possesses into indexed subblocks. The potential savings in communication that could be made if many different computer systems shared the same subblock partitioning algorithm suggests that some form of universal standardization on a particular partitioning method would be a worthy goal.

Example Application: A Subblock Server

Aspects of the invention could be used to establish a subblock server on a network so as to reduce network traffic. A subblock server could be located in a busy part of a network. It would consist of a computer that breaks each block of data it sees into subblocks, hashes the subblocks, and then stores them for future reference. Other computers on the network could send requests to the server for subblocks, the requests consisting of the hashes of subblocks the server might possess. The server would respond to each hash, returning either the subblock corresponding to the hash, or a message stating that the server does not possess a subblock corresponding to the hash.

Such a subblock server could be useful for localizing network traffic on the Internet. For example, if a subnetwork (even a large one for (say) an entire country) placed a subblock server on each of its major Internet connections, then (with the appropriate modification of various protocols) much of the traffic into the network could be eliminated. For example, if a user requested a file from a remote host on another network, the user's computer might issue the request and receive, in reply, not the file, but the hashes of the file's subblocks. The user's computer could then send the hashes to the local subblock server to see if the subblocks are present there. It would receive the subblocks that are present and then forward a request for the remaining subblocks to the remote host. The subblock server might notice the new subblocks flowing through it and archive them for future reference. The entire effect could be to eliminate most repeated data transfers between the subnetwork and the rest of the Internet. However, the security implications of schemes such as these would need to be closely investigated before there were deployed.

A further step could be to create "virtual" subblock servers that store the hashes of subblocks and their location on the Internet rather than the subblocks and their hashes.

I claim:

1. A method for organizing a block b of digital data for storage, communication, or comparison, comprising the step of:

partitioning said block b into a plurality of subblocks at at least one position k|k+1 within said block, for which b[k−A+1 . . . k+B] satisfies a predetermined constraint, and wherein A and B are natural numbers.

2. The method of claim 1, wherein the constraint comprises the hash of at least a portion of b[k−A+1 . . . k+B].

3. The method of claim 1, further comprising the step of:

locating the nearest subblock boundary on a side of a position p|p+1 within said block, said locating step comprising the step of:

evaluating whether said predetermined constraint is satisfied at each position k|k+1 for increasing or decreasing k, wherein k starts with the value p.

4. The method of claim 1, wherein at least one bound is imposed on the size of at least one of said plurality of subblocks.

5. The method of claim 1, wherein additional subblocks are formed from at least one group of subblocks.

6. The method of claim 1, wherein an additional hierarchy of subblocks is formed from at least one group of contiguous subblocks.

7. The method of claim 1, further comprising the step of:

calculating the hash of each of at least one of said plurality of subblocks.

8. The method of claim 1, further comprising the step of:

forming a projection of said block, being an ordered or unordered collection of elements, wherein each element consists of a subblock, an identity of a subblock, or a reference of a subblock.

9. The method of claim 1, wherein said subblocks are compared by comparing the hashes of said subblocks.

10. The method of claim 1, wherein subsets of identical subblocks within a group of one or more subblocks are found by inserting each subblock, an identity of each subblock, a reference of each subblock, or a hash of each subblock into a data structure.

11. A method for comparing one or more blocks, comprising the steps of:

organizing a block b of digital data for the purpose of comparison, comprising the step of:
partitioning said block b into a plurality of subblocks at at least one position k|k+1 within said block;
for which b[k−A+1 ... k+B] satisfies a predetermined constraint; and
wherein A and B are natural numbers, forming a projection of each said block, being a collection of elements, wherein each element comprises a selected one of a subblock, an identity of a subblock, and a reference of a subblock, and comparing the elements of said projections of said blocks.

12. A method for representing one or more blocks comprising a collection of subblocks and block representatives which are mapped to lists of entries which identify subblocks; said method comprising the step of modifying one of said blocks including the steps of:

partitioning said block into a plurality of subblocks at at least one position k|k+1 within said block, for which b[k−A+1 ... k+B] satisfies a predetermined constraint, and wherein A and B are natural numbers, adding to said collection of subblocks zero or more subblocks which are not already in said collection, and updating said subblock list associated with said modified block.

13. A method for representing one or more blocks comprising a collection of subblocks and block representatives which are mapped to lists of entries which identify subblocks; said method comprising the step of modifying one of said blocks including the steps of:

partitioning said block into a plurality of subblocks at at least one position k|k+1 within said block, for which b[k−A+1 ... k+B] satisfies a predetermined constraint, and wherein A and B are natural numbers, removing from said collection of subblocks zero or more subblocks, and updating said subblock list associated with said modified block.

14. A method for representing one or more blocks comprising a collection of subblocks and block representatives which are mapped to lists of entries which identify subblocks; said method comprising the step of modifying one of said blocks including the steps of:

partitioning said block into a plurality of subblocks at at least one position k|k+1 within said block, for which b[k−A+1 ... k+B] satisfies a predetermined constraint, and wherein A and B are natural numbers, adding to said collection of subblocks zero or more subblocks that are not already in the collection, removing from said collection of subblocks zero or more subblocks, and updating said subblock list associated with said modified block.

15. A method for an entity E1 to communicate a block X to E2 where E1 possesses the knowledge that E2 possesses a group of Y subblocks $Y_1 \ldots Y_m$, comprising the steps of:

partitioning said block X into a plurality of subblocks $X_1 \ldots X_n$ at at least one position k|k+1 within said block, for which X[k−A+1 ... k+B] satisfies a predetermined constraint, and wherein A and B are natural numbers, and transmitting from E1 to E2 the contents of zero or more subblocks in $X_1$ and the remaining subblocks as references to subblocks in $Y_1 \ldots Y_m$, and to subblocks transmitted.

16. A method for an entity E1 to communicate one or more subblocks of a group X of subblocks $X_1 \ldots X_n$ to E2 where E1 possesses the knowledge that E2 possesses a block Y, comprising the steps of:

partitioning said block Y into a plurality of subblocks $Y_1 \ldots Y_m$ at at least one position k|k+1 within said block, for which Y[k−A+1 ... k+B] satisfies a predetermined constraint, and wherein A and B are natural numbers, and transmitting from E1 to E2 the contents of zero or more subblocks in X, and the remaining subblocks as references to subblocks in Y, and to subblocks already transmitted.

17. A method for an entity E1 to communicate a block X to E2 where E1 possesses the knowledge that E2 possesses a block Y, comprising the steps of:

partitioning said block X into a plurality of subblocks $X_1 \ldots X_n$ at at least one position k|k+1 within said block, for which X[k−A+1 ... k+B] satisfies a predetermined constraint, and wherein A and B are natural numbers, partitioning said block Y into a plurality of subblocks $Y_1 \ldots Y_m$ at at least one position k|k+1 within said block, for which Y[k−A+1 ... k+B] satisfies a predetermined constraint, and wherein A and B are natural numbers, and transmitting from E1 to E2 the contents of zero or more subblocks in X, and the remaining subblocks as references to subblocks in Y, and to subblocks already transmitted.

18. A method for constructing a block D from a block X and a group Y of subblocks $Y_1 \ldots Y_m$ such that X can be constructed from Y and D, comprising the steps of:

partitioning said block X into a plurality of subblocks $X_1 \ldots X_n$ at at least one position k|k+1 within said block, for which X[k−A+1 ... k+B] satisfies a predetermined constraint, and wherein A and B are natural numbers, and constructing D from a selected at least one of:
  the contents of zero or more subblocks in X,
  references to zero or more subblocks in Y, and
  references to zero or more subblocks in D.

19. A method for constructing a block D from a group X of subblocks $X_1 \ldots X_n$ and a block Y such that X can be constructed from Y and D, comprising the steps of:
  partitioning said block Y into a plurality of subblocks $Y_1 \ldots Y_m$ at at least one position k|k+1 within said block, for which Y[k−A+1 ... k+B] satisfies a predetermined constraint, and wherein A and B are natural numbers, and
  constructing D from a selected at least one of:
    the contents of zero or more subblocks in X,
    references to zero or more subblocks in Y, and
    references to zero of more subblocks in D.

20. A method for constructing a block D from a block X and a block Y such that X can be constructed from Y and D, comprising the steps of:
  partitioning said block X into a plurality of subblocks $X_1 \ldots X_n$ at at least one position k|k+1 within said block, for which X[k−A+1 ... k+B] satisfies a predetermined constraint, and wherein A and B are natural numbers,
  partitioning said block Y into a plurality of subblocks $Y_1 \ldots Y_m$ at at least one position k|k+1 within said block, for which Y[k−A+1 ... k+B] satisfies a predetermined constraint, and wherein A and B are natural numbers, and
  constructing D from a selected at least one of:
    the contents of zero or more in X,
    references to zero or more subblocks in Y, and
    references to zero or more subblocks in D.

21. A method for constructing a block D from a block X and a projection Y said projection comprising a collection of elements wherein said elements comprises a subblock in Y, an identity of a subblock in Y, or a reference of a subblock in Y, such that X can be constructed from Y and D, comprising the steps of:
  partitioning said block X into a plurality of subblocks $X_1 \ldots X_n$ at at least one position k|k+1 within said block, for which X[k−A+1 ... k+B] satisfies a predetermined constraint, and wherein A and B are natural numbers, and
  constructing D from a selected at least one of:
    the contents of zero or more in X,
    references to zero or more subblocks in Y, and
    references to zero or more subblocks in D.

22. A method for constructing a block X from a block Y and a block D, comprising the steps of:
  partitioning said block Y into a plurality of subblocks $Y_1 \ldots Y_m$ at at least one position k|k+1 within said block, for which Y[k−A+1 ... k+B] satisfies a predetermined constraint, and wherein A and B are natural numbers, and
  constructing X from D and Y by constructing the subblocks of X based on a selected at least one of:
    subblocks contained within D,
    references in D to subblocks in Y, and
    references to D to subblocks in D.

23. A method for constructing a group X of subblocks $X_1 \ldots X_n$ from a block Y and a block D, comprising the steps of:
  partitioning said block Y into a plurality of subblocks $Y_1 \ldots Y_m$ at at least one position k|k+1 within said block, for which Y[k−A+1 ... k+b] satisfies a predetermined constraint, and wherein A and B are natural numbers, and
  constructing $X_1 \ldots X_n$ from D and Y based on a selected at least one of:
    subblocks contained within D,
    references in D to subblocks in Y, and
    references to D to subblocks in D.

24. A method for communicating a data block X from one entity E1 to another entity E2, comprising the steps of:
  partitioning said block X into a plurality of subblocks $X_1 \ldots X_n$ at at least one position k|k+1 within said block, for which X[k−A+1 ... k+B] satisfies a predetermined constraint, and wherein A and B are natural numbers,
  transmitting from E1 to E2 an identity of at least one subblock,
  transmitting from E2 to E1 information communicating the presence or absence of subblocks at E2, and
  transmitting from E1 to E2 at least the subblocks identified as not being present at E2.

25. A method for communicating a block X from one entity E1 to another entity E2, comprising the steps of:
  partitioning said block X into a plurality of subblocks $X_1 \ldots X_n$ at at least one position k|k+1 within said block, for which X[k−A+1 ... k+B] satisfies a predetermined constraint, and wherein A and B are natural numbers,
  transmitting from E2 to E1 information communicating the presence or absence at E2 of members of a group Y of subblocks $Y_1 \ldots Y_m$, and
  transmitting from E1 to E2 the contents of zero or more subblocks in X, and the remaining subblocks as references to subblocks in $Y_1 \ldots Y_m$ and to subblocks already transmitted.

26. A method for an entity E2 to communicate to an entity E1 the fact that E2 possesses a block Y, comprising the steps of:
  partitioning said block Y into a plurality of subblocks $Y_1 \ldots Y_m$ at at least one position k|k+1 within said block, for which Y[k−A+1 ... k+B] satisfies a predetermined constraint, and wherein A and B are natural numbers, and
  transmitting from E2 to E1 references of the subblocks $Y_1 \ldots Y_m$.

27. A method for an entity E1 to communicate a subblock $X_1$ to an entity E2, comprising the steps of:
  partitioning said block X into a plurality of subblocks $X_1 \ldots X_n$ at at least one position k|k+1 within said block, for which X[k−A+1 ... k+B] satisfies a predetermined constraint, and wherein A and B are natural numbers,
  transmitting from E2 to E1 an identity of $X_i$,
  transmitting $X_i$ from E1 to E2.

28. An apparatus for organizing a block b of digital data for storage, communication, or comparison, comprising
  means for partitioning said block b into a plurality of subblocks at at least one position k|k+1 within said block, for which b[k−A+1 ... k+B] satisfies a predetermined constraint, and wherein A and B are natural numbers.

29. The apparatus of claim 28, in which the constraint comprises the hash of some or all of b[k−A+1 . . . k+B].

30. The apparatus of claim 28, further comprising
means for locating the nearest subblock boundary on a side of a position p|p+1 within said block, said means for locating comprising:
means for evaluating whether said predetermined constraint is satisfied at each position k|k+1 for increasing or decreasing k,
wherein k starts with the value p.

* * * * *

(12) EX PARTE REEXAMINATION CERTIFICATE (8136th)
United States Patent
Williams

(10) Number: US 5,990,810 C1
(45) Certificate Issued: Apr. 5, 2011

(54) METHOD FOR PARTITIONING A BLOCK OF DATA INTO SUBBLOCKS AND FOR STORING AND COMMUNICATING SUCH SUBBLOCKS

(75) Inventor: Ross Neil Williams, Adelaide (AU)

(73) Assignee: Rocksoft Limited, Shell House, Adelaide (AU)

Reexamination Request:
No. 90/009,462, May 11, 2009

Reexamination Certificate for:
Patent No.: 5,990,810
Issued: Nov. 23, 1999
Appl. No.: 08/894,091
Filed: Aug. 15, 1997

(22) PCT Filed: Feb. 15, 1996
(86) PCT No.: PCT/AU96/00081
§ 371 (c)(1),
(2), (4) Date: Aug. 15, 1997
(87) PCT Pub. No.: WO96/25801
PCT Pub. Date: Aug. 22, 1996

(51) Int. Cl.
*H03M 7/00* (2006.01)

(52) U.S. Cl. .................. 341/51; 341/67; 707/E17.01
(58) Field of Classification Search ................. None
See application file for complete search history.

(56) References Cited

U.S. PATENT DOCUMENTS 4,541,076 A 9/1985 Bowers et al.
4,876,541 A 10/1989 Storer
5,049,881 A 9/1991 Gibson et al.

OTHER PUBLICATIONS

Ross Williams, "An Algorithm for matching text (possibly original)." Google Groups, Comp.Compression, posted Jan. 27, 1992 in 4 pages.

Richard M. Karp and Michael O. Rabin, "Efficient randomized pattern–matching algorithms." Ibm J. Res. Develop., Mar. 1987, pp. 249–260, pp. 249–260, vol. 31, No. 2.

*Primary Examiner*—Minh T Nguyen

(57) ABSTRACT

This invention provides a method and apparatus for detecting common spans within one or more data blocks by partitioning the blocks (FIG. 4) into subblocks and searching the group of subblocks (FIG. 12) (or their corresponding hashes (FIG. 13)) for duplicates. Blocks can be partitioned into subblocks using a variety of methods, including methods that place subblock boundaries at fixed positions (FIG. 3), methods that place subblock boundaries at data-dependent positions (FIG. 3), and methods that yield multiple overlapping subblocks (FIG. 6). By comparing the hashes of subblocks, common spans of one or more blocks can be identified without ever having to compare the blocks or subblocks themselves (FIG. 13). This leads to several applications including an incremental backup system that backs up changes rather than changed files (FIG. 25), a utility that determines the similarities and differences between two files (FIG. 13), a file system that stores each unique subblock at most once (FIG. 26), and a communications system that eliminates the need to transmit subblocks already possessed by the receiver (FIG. 19).

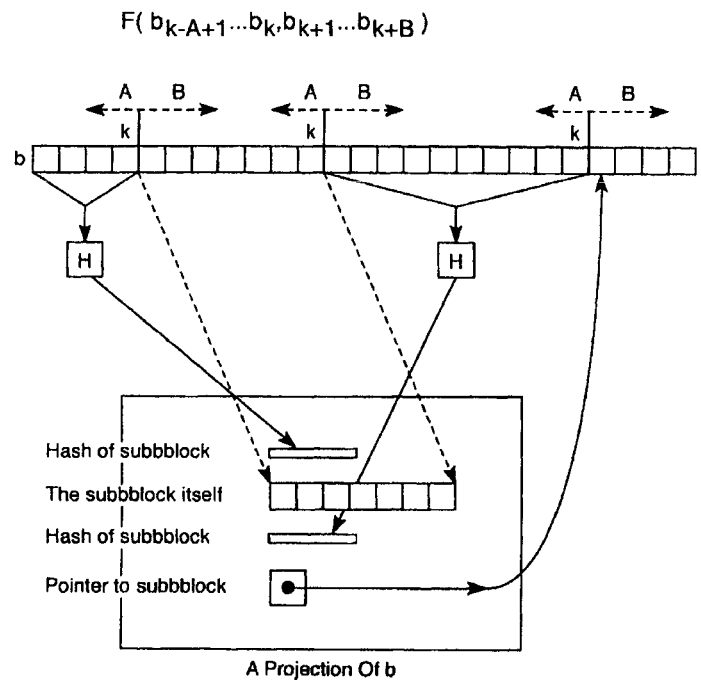

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 24 is confirmed.

Claims 2-3, 5-6, 12-14 and 30 are cancelled.

Claims 1, 4, 7-11, 15-23 and 25-29 are determined to be patentable as amended.

New claims 31-86 are added and determined to be patentable.

1. A method for organizing a block b of digital data for storage, communication, or comparison, comprising[the step of]:
   [partitioning said block b into a plurality of subblocks at at least one position k|k+1 within said block,] *partitioning b into a plurality of subblocks $sb_1 \ldots sb_n$, at positions $k_x|k_x+1$ in b, n being an integer greater than 2, x being an integer less than n,*
   [for which b[k-A+1 . . . k+B] satisfies a predetermined constraint, and wherein A and B are natural numbers.] *where a position $k_x|k_x+1$ in b is selected to partition b when data in a window $b[k_x-A+1 \ldots k_x+B]$ satisfies a predetermined constraint, A and B being natural numbers,*
   *where data in the window $b[k_x-A+1 \ldots k_x+B]$ satisfies the predetermined constraint when a partitioning constraint function F applied to at least a portion of data in the window $b[k_x-A+1 \ldots k_x+B]$ produces a value that matches a predetermined constant value V,*
   *where $F(b[k_x-A+1 \ldots k_x+B])$ hashes $b[k_x-A+1 \ldots k_x+B]$ using a hash function that depends, at least in part, on p, p being the probability of placing a boundary at an arbitrary position in a randomly generated block of data.*

4. The method of claim 1, [wherein at least one bound is imposed on the size of at least one of said plurality of subblocks] *where at least one bound is imposed on the size of a member of the plurality of subblocks $sb_1 \ldots sb_n$.*

7. The method of claim 1, [further] comprising[the steps of]:
   [calculating the hash of each of at least one of said plurality of subblocks] *calculating an identity hash for a member of the plurality of subblocks $sb_1 \ldots sb_n$.*

8. The method of claim [1] *7*, [further] comprising[the step of]:
   [forming a projection of said block, being an ordered or unordered collection of elements, wherein each element consists of a subblock, an identity of a subblock, or a reference of a subblock]
   *forming a projection of b, the projection comprising a collection of elements, an element being a subblock from the plurality of subblocks $sb_1 \ldots sb_n$, an identity hash of a subblock from the plurality of subblocks $sb_1 \ldots sb_n$, or a reference to a subblock from the plurality of subblocks $sb_1 \ldots sb_n$.*

9. The method of claim 1, [wherein said subblocks are compared by comparing the hashes of said subblocks] *comprising:*
   *calculating a first identity hash for a first member of the plurality of subblocks $sb_1 \ldots sb_n$,*
   *calculating a second identity hash for a second member of the plurality of subblocks $sb_1 \ldots sb_n$, and*
   *comparing the first member to the second member by comparing the first identity hash to the second identity hash.*

10. The method of claim 1, [wherein subsets of identical subblocks within a group of one or more subblocks are found by inserting each subblock, an identity of each subblock, a reference of each subblock, or a hash or each subblock into a data structure] *comprising:*
    *finding subsets of identical subblocks in a group of one or more subblocks by inserting an item into a data structure associated with the group of one or more subblocks, the item being a subblock, an identity of a subblock, a reference to a subblock, or a hash of a subblock.*

11. [A method for comparing one or more blocks, comprising the steps of:] *The method of claim 7, comprising:*
    [organizing a block b of digital data for the purpose of comparison, comprising the step of:
    partitioning said block b into a plurality of subblocks at at least one position k|k+1 within said block;
    for which b[k-A+1 . . . k+B] satisfies a predetermined constraint; and wherein A and B are natural numbers,]
    *comparing b to a block b2 by:*
    *partitioning b2 into a plurality of subblocks $sb2_1 \ldots sb2_n$, at positions $k2_x|k2_x+1$ in b2, n being an integer greater than 2, x being an integer less than n,*
    *where a position $k2_x|k2_x+1$ in b2 is selected to partition b2 when data in a window $b2[k2_x-A+1 \ldots k2_x+B]$ satisfies the predetermined constraint,*
    [forming a projection of each said block, being a collection of elements, wherein each element comprises a selected one of a subblock, an identity of a subblock, and a reference of a subblock,]
    *forming a projection of b, the projection of b comprising a collection of elements C1, a member of the collection of elements C1 being a subblock from the plurality of subblocks $sb_1 \ldots sb_n$, an identity hash of a subblock from the plurality of subblocks $sb_1 \ldots sb_n$, or a reference to a subblock from the plurality of subblocks $sb_1 \ldots sb_n$,*
    *forming a projection of b2, the projection of b2 comprising a collection of elements C2, a member of the collection of elements C2 being a subblock from the plurality of subblocks $sb2_1 \ldots sb2_n$, an identity hash of a subblock from the plurality of subblocks $sb2_1 \ldots sb2_n$, or a reference to a subblock from the plurality of subblocks $sb2_1 \ldots sb2_n$, and*
    [comparing the elements of said projections of said blocks] *comparing elements of the projection of b to elements of the projection of b2.*

15. A method for an entity E1 to communicate a block X to *an entity* E2 where E1 possesses [the] *knowledge that E2* possesses a group of [Y] subblocks $Y_1 \ldots Y_m$, *the method* comprising[the steps of]:

[partitioning said block X into a plurality of subblocks $X_1 \ldots X_n$ at at least one position k|k+1 within said block, for which X[k−A+1 . . . k+B] satisfies a predetermined constraint, and wherein A and B are natural numbers, and] *partitioning X into a plurality of subblocks $X_1 \ldots X_n$, at positions $k_x|k_x+1$ in X, n being an integer greater than 2, x being an integer less than n,*

*where a position $k_x|k_x+1$ in X is selected to partition X when data in a window $X[k_x−A+1 \ldots k_x+B]$ satisfies a predetermined constraint, A and B being natural numbers,*

*where data in the window $X[k_x−A+1 \ldots k_x+B]$ satisfies the predetermined constraint when a partitioning constraint function F applied to at least a portion of data in the window $X[k_x−A+1 \ldots k_x+B]$ produces a value that matches a predetermined constant value V,*

*where $F(X[k_x−A+1 \ldots k_x+B])$ hashes $X[k_x−A+1 \ldots k_x+B]$ using a hash function that depends, at least in part, on $\rho$, $\rho$ being the probability of placing a boundary at an arbitrary position in a randomly generated block of data,*

*where the group of subblocks $Y_1 \ldots Y_m$ was created on E2 by partitioning a block Y at positions $k_y|k_y+1$ in Y, m being an integer greater than 2, y being an integer less than m,*

*where a position $k_y|k_y+1$ in Y partitioned Y when data in a window $Y[k_y−A+1 \ldots k_y+B]$ satisfied the predetermined constraint, and*

[transmitting from E1 to E2 the contents of zero or more subblocks in X, and the remaining subblocks as references to subblocks in $Y_1 \ldots Y_m$, and to subblocks transmitted.] *transmitting from E1 to E2 a set of items representing the plurality of subblocks $X_1 \ldots X_n$;*

*the set of items comprising:*

*zero or more subblocks from the plurality of subblocks $X_1 \ldots X_n$;*

*zero or more references to subblocks in the group of subblocks $Y_1 \ldots Y_m$; and*

*zero or more references to subblocks previously transmitted from E1 to E2.*

16. A method for an entity E1 to communicate one or more subblocks of a group [X] of subblocks $X_1 \ldots X_n$ to *an* entity E2 where E1 possesses [the] knowledge that E2 possesses a block Y, *the method* comprising[the steps of]:

[partitioning said block Y into a plurality of subblocks $Y_1 \ldots Y_m$ at at least one position k|k+1 within said block, for which Y[k−A+1 . . . k+B] satisfies a predetermined constraint, and wherein A and B are natural numbers, and] *partitioning Y into a plurality of subblocks $Y_1$ through $Y_m$, at positions $k_y|k_y+1$ in Y, m being an integer greater than 2, y being an integer less than m,*

*where a position $k_y|k_y+1$ in Y is selected to partition Y when data in a window $Y[k_y−A+1 \ldots k_y+B]$ satisfies a predetermined constraint, A and B being natural numbers,*

*where data in the window $Y[k_y−A+1 \ldots k_y+B]$ satisfies the predetermined constraint when a partitioning constraint function F applied to at least a portion of data in the window $Y[k_y−A+1 \ldots k_y+B]$ produces a value that matches a predetermined constant value V,*

*where $F(Y[k_y−A+1 \ldots k_y+B])$ hashes $Y[k_y−A+1 \ldots k_y+B]$ using a hash function that depends, at least in part, on $\rho$, $\rho$ being the probability of placing a boundary at an arbitrary position in a randomly generated block of data,*

*where the group of subblocks $X_1 \ldots X_n$ was created by partitioning a block X at positions $k_x|k_x+1$ in X, n being an integer greater than 2, x being an integer less than n,*

*where a position $k_x|k_x+1$ in X partitioned X when data in a window $X[k_x−A+1 \ldots k_x+B]$ satisfied the predetermined constraint, and*

[transmitting from E1 to E2 the contents of zero or more subblocks in X, and the remaining subblocks as references to subblocks in Y, and to subblocks already transmitted.] *transmitting from E1 to E2 a set of items representing the group of subblocks $X_1 \ldots X_n$, the set of items comprising:*

*zero or more subblocks from the group of subblocks $X_1 \ldots Y_n$;*

*zero or more references to subblocks in the plurality of subblocks $Y_1 \ldots Y_m$; and*

*zero or more references to subblocks previously transmitted from E1 to E2.*

17. A method for an entity E1 to communicate a block X to *an entity* E2 where E1 possesses [the] knowledge that E2 possesses a block Y, *the method* comprising[the steps of]:

[partitioning said block X into a plurality of subblocks $X_1 \ldots X_n$ at least one position k|k+1 within said block, for which X[k−A+1 . . . k+B] satisfies a predetermined constraint, and wherein A and B are natural numbers,] *partitioning X into a plurality of subblocks $X_1 \ldots X_n$, at positions $k_x|k_x+1$ in X, n being an integer greater than 2, x being an integer less than n,*

*where a position $k_x|k_x+1$ in X is selected to partition X when data in a window $X[k_x−A+1 \ldots k_x+B]$ satisfies a predetermined constraint, A and B being natural numbers,*

*where data in the window $X[k_x−A+1 \ldots k_x+B]$ satisfies the predetermined constraint when a partitioning constraint function F applied to at least a portion of data in the window $X[k_x−A+1 \ldots k_x+B]$ produces a value that matches a predetermined constant value V,*

*where $F(X[k_x−A+1 \ldots k_x+B])$ hashes $X[k_x−A+1 \ldots k_x+B]$ using a hash function that depends, at least in part, on $\rho$, $\rho$ being the probability of placing a boundary at an arbitrary position in a randomly generated block of data,*

[partitioning said block Y into a plurality of subblocks $Y_1 \ldots Y_m$ at least one position k|k+1 within said block, for which Y[k−A+1 . . . k+B] satisfies a predetermined constraint, and wherein A and B are natural numbers, and]

*partitioning Y into a plurality of subblocks $Y_1 \ldots Y_m$, at positions $k_y|k_y+1$ in Y, m being an integer greater than 2, y being an integer less than m,*

*where a position $k_y|k_y+1$ in Y is selected to partition Y when data in a window $Y[k_y−A+1 \ldots k_y+B]$ satisfies the predetermined constraint, and*

[transmitting from E1 to E2 the contents of zero or more subblocks in X, and the remaining subblocks as references to subblocks in Y, and to subblocks already transmitted.] *transmitting from E1 to E2 a set of items representing the plurality of subblocks $X_1 \ldots X_n$;*

*the set of items comprising:*

*zero or more subblocks from the plurality of subblocks $X_1 \ldots X_n$;*

*zero or more references to subblocks in the plurality of subblocks $Y_1 \ldots Y_m$; and*

*zero or more references to subblocks previously transmitted from E1 to E2.*

18. A method for constructing [a] *an incremental changes* block D from a block X and a group [Y] of subblocks $Y_1 \ldots Y_m$ *representing a block Y* such that X can be constructed from Y and D, *X being a current version of a block, Y being a prior version of X*, the method comprising[the steps of]:

[partitioning said block X into a plurality of subblocks $X_1 \ldots X_n$, at at least one position k|k+1 within said block, for which X[k–A+1 … k+B] satisfies a predetermined constraint, and wherein A and B are natural numbers, and] *partitioning X into a plurality of subblocks $X_1 \ldots X_n$, at positions $k_x|k_x+1$ in X, n being an integer greater than 2, x being an integer less than n,*

*where a position $k_x|k_x+1$ in X is selected to partition X when data in a window $X[k_x–A+1 \ldots k_x+B]$ satisfies a predetermined constraint, A and B being natural numbers,*

*where data in the window $X[k_x–A+1 \ldots k_x+B]$ satisfies the predetermined constraint when a partitioning constraint function F applied to at least a portion of data in the window $X[k_x–A+1 \ldots k_x+B]$ produces a value that matches a predetermined constant value V,*

*where $F(X[k_x–A+1 \ldots k_x+B])$ hashes $X[k_x–A+1 \ldots k_x+B]$ using a hash function that depends, at least in part, on ρ, ρ being the probability of placing a boundary at an arbitrary position in a randomly generated block of data,*

*where the group of subblocks $Y_1 \ldots Y_m$ was created by partitioning Y at positions $k_y|k_y+1$ in Y, m being an integer greater than 2, y being an integer less than m,*

*where a position $k_y|k_y+1$ in Y partitions Y when data in a window $Y[k_y–A+1 \ldots k_y+B]$ satisfied the predetermined constraint, and*[constructing D from a selected at least one of:

the contents of zero or more subblocks in X, references to zero or more subblocks in Y, and references to zero or more subblocks in D.]

constructing incremental changes block D from one or more of:

zero or more members of the group of subblocks $X_1 \ldots X_n$;

zero or more references to a member of the group of subblocks $Y_1 \ldots Y_m$; and zero or more references to subblocks in D.

19. A method for constructing [a] *an incremental changes* block D from a group [X] of subblocks $X_1 \ldots X_n$ *representing a block X* and a block Y such that X can be [constructed] *recreated* from Y and D, *X being a current version of a block, Y being a prior version of X*, the method comprising[the steps of]:

[partitioning said block Y into a plurality of subblocks $Y_1 \ldots Y_m$, at at least one position k|k+1 within said block, for which Y[k–A+1 … k+B] satisfies a predetermined constraint, and wherein A and B are natural numbers, and] *partitioning Y into a plurality of subblocks $Y_1 \ldots Y_m$, at positions $k_y|k_y+1$ in Y, m being an integer greater than 2, y being an integer less than m,*

*where a position $k_y|k_y+1$ in Y is selected to partition Y when data in a window $Y[k_y–A+1 \ldots k_y+B]$ satisfies a predetermined constraint, A and B being natural numbers,*

*where data in the window $Y[k_y–A+1 \ldots k_y+B]$ satisfies the predetermined constraint when a partitioning constraint function F applied to at least a portion of data in the window $Y[k_y–A+1 \ldots k_y+B]$ produces a value that matches a predetermined constant value V,*

*where $F(Y[k_y–A+1 \ldots k_y+B])$ hashes $Y[k_y–A+1 \ldots k_y+B]$ using a hash function that depends, at least in part, on ρ, ρ being the probability of placing a boundary at an arbitrary position in a randomly generated block of data,*

*where the group of subblocks $X_1 \ldots X_n$ was created by partitioning X at positions $k_x|k_x+1$ in X, n being an integer greater than 2, x being an integer less than n,*

*where a position $k_x|k_x+1$ in X partitions X when data in a window $X[k_x–A+1 \ldots k_x+B]$ satisfied the predetermined constraint, and*

[constructing D from a selected at least one of:

the contents of zero or more subblocks in X, references to zero or more subblocks in Y, and references to zero or more subblocks in D.] *constructing incremental changes block D from one or more of:*

*zero or more members of the group of subblocks $X_1 \ldots X_n$;*

*zero or more references to members of the group of subblocks $Y_1 \ldots Y_m$; and*

*zero or more references to subblocks in D.*

20. A method for constructing [a] *an incremental changes* block D from a block X and a block Y such that X can be [constructed] *recreated* from Y and D, *X being a current version of a block, Y being a prior version of X*, the method comprising[the steps of]:

[partitioning said block X into a plurality of subblocks $X_1 \ldots X_n$, at at least one position k|k+1 within said block, for which X[k–A+1 … k+B] satisfies a predetermined constraint, and wherein A and B are natural numbers, and] *partitioning X into a plurality of subblocks $X_1 \ldots X_n$, at positions $k_x|k_x+1$ in X, n being an integer greater than 2, x being an integer less than n,*

*where a position $k_x|k_x+1$ in X is selected to partition X when data in a window $X[k_x–A+1 \ldots k_x+B]$ satisfies a predetermined constraint, A and B being natural numbers,*

*where data in the window $X[k_x–A+1 \ldots k_x+B]$ satisfies the predetermined constraint when a partitioning constraint function F applied to at least a portion of data in the window $X[k_x–A+1 \ldots k_x+B]$ produces a value that matches a predetermined constant value V,*

*where $F(X[k_x–A+1 \ldots k_x+B])$ hashes $X[k_x–A+1 \ldots k_x+B]$ using a hash function that depends, at least in part, on ρ, ρ being the probability of placing a boundary at an arbitrary position in a randomly generated block of data,*

[partitioning said block Y into a plurality of subblocks $Y_1 \ldots Y_m$, at least one position k|k+1 within said block, for which Y[k–A+1 … k+B] satisfies a predetermined constraint, and wherein A and B are natural numbers, and] *partitioning Y into a plurality of subblocks $Y_1 \ldots Y_m$ by partitioning Y at positions $k_y|k_y+1$ in Y, m being an integer greater than 2, y being an integer less than m,*

*where a position $k_y|k_y+1$ in Y is selected to partition Y when data in a window $Y[k_y–A+1 \ldots k_y+B]$ satisfies the predetermined constraint, and*

[constructing D from a selected at least one of:

the contents of zero or more in X, references to zero or more subblocks in Y, and references to zero or more subblocks in D.] *constructing incremental changes block D from one or more of:* zero or more members of the group of subblocks $X_1 \ldots X_n$;
zero or more references to a member of the group of subblocks $Y_1 \ldots Y_m$; and
zero or more references to subblocks in D.

21. A method for constructing [a] *an incremental changes* block D from a block X and a projection PY of a block Y [said] *the* projection [Y] *PY* comprising a collection of elements, [wherein said elements comprises] *an element being* a subblock in Y, an identity of a subblock in Y, or a reference [of] *to* a subblock in Y, such that X can be constructed from Y and D, comprising[the steps of]:

[partitioning said block X into a plurality of subblocks $X_1 \ldots X_n$, at at least one position k|k+1 within said block, for which X[k−A+1 ... k+B] satisfies a predetermined constraint, and wherein A and B are natural numbers, and] *partitioning X into a plurality of subblocks $X_1 \ldots X_n$, at positions $k_x|k_x+1$ in X, n being an integer greater than 2, x being an integer less than n,*

*where a position $k_x|k_x+1$ in X is selected to partition X when data in a window $X[k_x-A+1 \ldots k_x+B]$ satisfies a predetermined constraint, A and B being natural numbers,*

*where data in the window $X[k_x-A+1 \ldots k_x+B]$ satisfies the predetermined constraint when a partitioning constraint function F applied to at least a portion of data in the window $X[k_x-A+1 \ldots k_x+B]$ produces a value that matches a predetermined constant value V,*

*where $F(X[k_x-A+1 \ldots k_x+B])$ hashes $X[k_x-A+1 \ldots k_x+B]$ using a hash function that depends, at least in part, on $\rho$, $\rho$ being the probability of placing a boundary at an arbitrary position in a randomly generated block of data,*

*where the projection PY was created by partitioning Y into a plurality of subblocks $Y_1 \ldots Y_m$ by partitioning Y at positions $k_y|k_y+1$ in Y, m being an integer greater than 2, y being an integer less than m,*

*where a position $k_y|k_y+1$ in Y partitions Y when data in a window $Y[k_y-A+1 \ldots k_y+B]$ satisfied the predetermined constraint, and*

*forming the projection PY as a collection of elements C1, a member of the collection of elements C1 being a subblock from the plurality of subblocks $Y_1 \ldots Y_m$, an identity of a subblock from the plurality of subblocks $Y_1 \ldots Y_m$, or a reference to a subblock from the plurality of subblocks $Y_1 \ldots Y_m$;*

[constructing D from a selected at least one of:
the contents of zero or more in X,
references to zero or more subblocks in Y, and
references to zero or more subblocks in D.] *constructing incremental changes block D from one or more of:*
*zero or more members of the plurality of subblocks $X_1 \ldots X_n$;*
*zero or more references to a member of the plurality of subblocks $Y_1 \ldots Y_m$; and*
*zero or more references to subblocks in D.*

22. A method for constructing a block X from a block Y and a block D, X representing a current version of a file, Y representing a prior version of X, and D representing incremental changes to X since Y was created, comprising[the steps of]:

*partitioning X into a plurality of subblocks $X_1 \ldots X_n$, at positions $k_x|k_x+1$ in X, n being an integer greater than 2, x being an integer less than n,*

*where a position $k_x|k_x+1$ in X is selected to partition X when data in a window $X[k_x-A+1 \ldots k_x+B]$ satisfies a predetermined constraint, A and B being natural numbers,*

*where data in the window $X[k_x-A+1 \ldots k_x+B]$ satisfies the predetermined constraint when a partitioning constraint function F applied to at least a portion of data in the window $X[k_x-A+1 \ldots k_x+B]$ produces a value that matches a predetermined constant value V,*

*where $F(X[k_x-A+1 \ldots k_x+B])$ hashes $X[k_x-A+1 \ldots k_x+B]$ using a hash function that depends, at least in part, on $\rho$, $\rho$ being the probability of placing a boundary at an arbitrary position in a randomly generated block of data,*

[partitioning said block Y into a plurality of subblocks $Y_1 \ldots Y_m$ at at least one position k|k+1 within said block, for which Y[k−A+1 ... k+B] satisifies a predetermined constraint, and wherein a and B are natural numbers, and] *partitioning Y into a plurality of subblocks $Y_1 \ldots Y_m$ by partitioning Y at positions $k_y|k_y+1$ in Y, m being an integer greater than 2, y being an integer less than m,*

*where a position $k_y|k_y+1$ in Y is selected to partition Y when data in a window $Y[k_y-A+1 \ldots k_y+B]$ satisfies the predetermined constraint, and*

[constructing X from D and Y by constructing the subblocks of X based on a selected at least one of:
subblocks contained within D,
references in D to subblocks in Y, and
references to d to subblocks in D.] *constructing X from D and Y by constructing the subblocks $X_1 \ldots X_n$ from zero or more subblocks in D, zero or more references in D to subblocks $Y_1 \ldots Y_m$ and zero or more references in D to subblocks in D.*

23. A method for constructing a group [X] of subblocks $X_1 \ldots X_n$ from a block Y and a block D, $X_1 \ldots X_n$ representing a current version of an item X, Y representing a prior version of X, and D representing incremental changes to X since Y was created, comprising[the steps of]:

[partitioning said block Y into a plurality of subblocks $Y_1 \ldots Y_m$ at at least one position k|k+1 within said block, for which Y[k−A+1 ... k+B] satisfies a predetermined constraint, and wherein a and B are natural numbers, and] *partitioning Y into a plurality of subblocks $Y_1 \ldots Y_m$, at positions $k_y|k_y+1$ in Y, m being an integer greater than 2, y being an integer less than m,*

*where a position $k_y|k_y+1$ in Y is selected to partition Y when data in a window $Y[k_y-A+1 \ldots k_y+B]$ satisfies a predetermined constraint, A and B being natural numbers,*

*where data in the window $Y[k_y-A+1 \ldots k_y+B]$ satisfies the predetermined constraint when a partitioning constraint function F applied to at least a portion of data in the window $Y[k_y-A+1 \ldots k_y+B]$ produces a value that matches a predetermined constant value V,*

*where $F(Y[k_y-A+1 \ldots k_y+B])$ hashes $Y[k_y-A+1 \ldots k_y+B]$ using a hash function that depends, at least in part, on $\rho$, $\rho$ being the probability of placing a boundary at an arbitrary position in a randomly generated block of data, and*

[constructing X from D and Y by constructing the subblocks of X based on a selected at least one of:
subblocks contained within D,
references in D to subblocks in Y, and
references to D to subblocks in D.] *constructing $X_1 \ldots X_n$ from zero or more subblocks in D, zero or more references in D to subblocks $Y_1 \ldots Y_m$ and zero or more references in D to subblocks in D.*

25. A method for communicating a block X from one entity E1 to another entity E2, comprising[the steps of]:

[partitioning said block X into a plurality of subblocks $X_1 \ldots X_n$ at least one position k|k+1 within said block, for which X[k−A+1 ... k+B] satisfies a predetermined constraint, and wherein A and B are natural numbers,] *partitioning X into a plurality of subblocks $X_1 \ldots X_n$, at positions $k_x|k_x+1$ in X, n being an integer greater than 2, x being an integer less than n,*

*where a position $k_x|k_x+1$ in X is selected to partition X when data in a window $X[k_x−A+1 \ldots k_x+B]$ satisfies a predetermined constraint, A and B being natural numbers,*

*where data in the window $X[k_x−A+1 \ldots k_x+B]$ satisfies the predetermined constraint when a partitioning constraint function F applied to at least a portion of data in the window $X[k_x−A+1 \ldots k_x+B]$ produces a value that matches a predetermined constant value V,*

*where $F(X[k_x−A+1 \ldots k_x+B])$ hashes $X[k_x−A+1 \ldots k_x+B]$ using a hash function that depends, at least in part, on ρ, ρ being the probability of placing a boundary at an arbitrary position in a randomly generated block of data,*

*where Y was partitioned into a plurality of subblocks $Y_1 \ldots Y_m$ by partitioning Y at positions $k_y|k_y+1$ in Y, m being an integer greater than 2, y being an integer less than m,*

*where a position $k_y|k_y+1$ in Y partitions Y when data in a window $Y[k_y−A+1 \ldots k_y+B]$ satisfied the predetermined constraint,*

[transmitting from E2 to E1 information communicating the presence or absence at E2 of members of a group Y of subblocks $Y_1 \ldots Y_m$, and] *receiving from E2 information concerning the plurality of subblocks $Y_1 \ldots Y_m$;* and

[transmitting from E1 to E2 the contents of zero or more subblocks in X, and the remaining subblocks as references to subblocks in $Y_1 \ldots Y_m$ and to subblocks already transmitted.] *transmitting from E1 to E2 a set of information concerning the entire plurality of subblocks $X_1 \ldots X_n$, the set of information comprising, zero or more members of the plurality of subblocks $X_1 \ldots X_n$, zero or more references to members of the plurality of subblocks $Y_1 \ldots Y_m$, and zero or more references to members of a plurality of subblocks $X_1 \ldots X_n$ already transmitted from E1 to E2.*

26. A method for an entity E2 to communicate to an entity E1 the fact that E2 possesses a block Y, comprising[the steps of]:

[partitioning said block Y into a plurality of subblocks $Y_1 \ldots Y_m$ at at least one position k|k+1 within said block, for which Y[k−A+1 ... k+B] satisfies a predetermined constraint, and wherein A and B are natural numbers, and] *partitioning Y into a plurality of subblocks $Y_1 \ldots Y_m$, at positions $k_y|k_y+1$ in Y, m being an integer greater than 2, y being an integer less than m,*

*where a position $k_y|k_y+1$ in Y is selected to partition Y when data in a window $Y[k_y−A+1 \ldots k_y+B]$ satisfies a predetermined constraint, A and B being natural numbers,*

*where data in the window $Y[k_y−A+1 \ldots k_y+B]$ satisfies the predetermined constraint when a partitioning constraint function F applied to at least a portion of data in the window $Y[k_y−A+1 \ldots k_y+B]$ produces a value that matches a predetermined constant value V,*

*where $F(Y[k_y−A+1 \ldots k_y+B])$ hashes $Y[k_y−A+1 \ldots k_y+B]$ using a hash function that depends, at least in part, on ρ, ρ being the probability of placing a boundary at an arbitrary position in a randomly generated block of data, and*

*transmitting from E2 to E1 references of the plurality of subblocks $Y_1 \ldots Y_m$.*

27. A method for an entity E1 to communicate a subblock $X_1$, to an entity E2, comprising[the steps of]:

[partitioning said block X into a plurality of subblocks $X_1 \ldots X_n$ at at least one position k|k+1 within said block, for which X[k−A+1 ... k+B] satisfies a predetermined constraint, and wherein A and B are natural numbers,] *partitioning a block X into a plurality of subblocks $X_1 \ldots X_n$, at positions $k_x|k_x+1$ in X, n being an integer greater than 2, x being an integer less than n,*

*where a position $k_x|k_x+1$ in X is selected to partition X when data in a window $X[k_x−A+1 \ldots k_x+B]$ satisfies a predetermined constraint, A and B being natural numbers,*

*where data in the window $X[k_x−A+1 \ldots k_x+B]$ satisfies the predetermined constraint when a partitioning constraint function F applied to at least a portion of data in the window $X[k_x−A+1 \ldots k_x+B]$ produces a value that matches a predetermined constant value V,*

*where $F(X[k_x−A+1 \ldots k_x+B])$ hashes $X[k_x−A+1 \ldots k_x+B]$ using a hash function that depends, at least in part, on ρ, ρ being the probability of placing a boundary at an arbitrary position in a randomly generated block of data,*

[transmitting from E2 to E1 an identity of $X_1$,] *receiving at E1 an identity of $X_i$ transmitted from E2; and*

*in response to receiving the identity of $X_i$ from E2, transmitting subblock $X_i$ from E1 to E2.*

28. An apparatus for organizing a block b of digital data for storage, communication, or comparison, comprising:

means for partitioning said block b into a plurality of subblocks at at least [one position] *two consecutive positions k|k+1 and j|j+1* within said block *b*, for which b[k−A+1 ... k+B] satisfies a predetermined constraint, *and b[j−A+1 ... j+B] satisfies the predetermined constraint,* [and wherein] *where* A and B are natural numbers.

29. The apparatus of claim 28, in which b[k−A+1 ... k+B] satisfying the *predetermined* constraint comprises calculating the hash of some or all of b[k−A+1 ... k+B] *and in which b[j−A+1 ... j+B] satisfying the predetermined constraint comprises calculating the hash of some or all of b[j−A+1 ... j+B]*.

*31. The method of claim 1, comprising:*

*selecting ρ to produce a desired subblock size.*

*32. The method of claim 31, comprising:*

*altering ρ upon determining that an observed subblock size differs from the desired subblock size by more than a threshold amount.*

*33. The method of claim 7, where the identity hash is computed using a strong, one-way, cryptographic hash function.*

*34. The method of claim 33, where $F(b[k_x−A+1 \ldots k_x+B])$ hashes $b[k_x−A+1 \ldots k_x+B]$ using a weak hash.*

*35. The method of claim 7, comprising:*

*creating a set of identity hashes $ih_1 \ldots ih_n$ where an identity hash $ih_x$ corresponds to a subblock $sb_x$ in the plurality of subblocks $sb_1 \ldots sb_n$; and*

*identifying a subblock $sb_u$ as a unique subblock in b by comparing an identity hash $ih_u$ for $sb_u$ to members of the set of identity hashes $ih_1 \ldots ih_n$.*

36. The method of claim 7, comprising:

identifying a subblock $sb_u$ from the plurality of subblocks $sb_1 \ldots sb_n$ as a unique subblock upon determining that an identity hash $ih_u$ computed for $sb_u$ is not present in a collection of stored identity hashes, where members of the collection of stored identity hashes are associated with unique subblocks.

37. The method of claim 36, comprising:

upon determining that $sb_u$ is a unique subblock, adding $ih_u$ to the collection of stored identity hashes.

38. The method of claim 37, comprising:

upon determining that $sb_u$ is a unique subblock, adding $sb_u$ to a collection of stored unique subblocks.

39. The method of claim 38, the collection of sotred identity hashes being stored in a hash table.

40. The method of claim 39, comprising:

organizing a second block B2 for storage, communication, or comparison by:
partitioning B2 into a second plurality of subblocks $sb2_1 \ldots sb2_n$ at at least one position $k|k+1$ in B2 for which $B2[k-A+1 \ldots k+B]$ satisfies the predetermined constraint.

41. The method of claim 40, comprising:

creating a candidate identity hash for a member of the second plurality of subblocks; and selectively storing the candidate identity hash in the collection of stored identity hashes upon determining that the candidate identity hash does not appear in the collection of stored identity hashes.

42. The method of claim 41, comprising:

selectively storing the member of the second plurality of subblocks in the collection of stored unique subblocks upon determining that the candidate identity hash does not appear in the collection of stored identity hashes.

43. The method of claim 7, comprising:

creating a projection of b comprising an identifier of b, zero or more of $sb_1 \ldots sb_n$, and zero or more identity hashes computed from $sb_1 \ldots sb_n$.

44. The method of claim 43, comprising:

identifying similarities between b and a second block B2 by comparing the projection of b to a projection of B2, where the projection of B2 was created using the same partitioning, hashing, and projection methods applied to create the projection of b.

45. The method of claim 39, comprising:

receiving a request to transfer a set of subblocks from a first computer housing the collection of stored identity hashes and the collection of stored unique subblocks to a second computer that is configured with a second collection of stored identity hashes and a second collection of stored unique subblocks that were created using the same partitioning and hashing methods that were used to create the collection of stored identity hashes and the collection of stored unique subblocks on the first computer; and controlling the first computer to selectively transmit to the second computer members of the collection of stored unique subblocks by identifying members of the set of subblocks that are already present on the second computer based, at least in part, on the collection of stored identity hashes and the second collection of stored identity hashes.

46. The method of claim 1, comprising:

selectively updating ρ to tune the predetermined constraint to a desired application.

47. The method of claim 1, comprising:

selectively updating ρ upon determining that an observed average subblock size for $sb_1 \ldots sb_n$ differs from a desired average subblock size by more than a threshold amount.

48. The method of claim 16, E1 and E2 being two separate computers.

49. The method of claim 48, where E1 and E2 are communicating for the first time since a predetermined period of time has expired.

50. The method of claim 48, where E1 and E2 are communicating for the first time.

51. The method of claim 17, E1 and E2 being two separate computers.

52. The method of claim 51, where E1 and E2 are communicating for the first time since a predetermined period of time has expired.

53. The method of claim 51, where E1 and E2 are communicating for the first time.

54. The method of claim 18, X being located on a first entity E1 and Y being located on a second entity E2.

55. The method of claim 19, X being located on a first entity E1 and Y being located on a second entity E2.

56. The method of claim 26, the references being identity hashes of subblocks in the plurality of subblocks $Y_1 \ldots Y_m$.

57. The method of claim 56, the identity hashes being stored in a hash table of unique identity hashes of unique subblocks present on E2.

58. The method of claim 57, the unique subblocks being stored in a data repository on E2.

59. The method of claim 27, E1 and E2 being separate computers.

60. The method of claim 59, the identity of $X_i$ being an identity hash of $X_i$.

61. The method of claim 7, comprising:

computing identity hashes for members of the plurality of subblocks $sb_1 \ldots sb_n$;

identifying unique subblocks in the plurality of subblocks $sb_1 \ldots sb_n$ by comparing identity hashes of the plurality of subblocks $sb_1 \ldots sb_n$;

storing unique subblocks from the plurality of subblocks $sb_1 \ldots sb_n$ in a repository of unique subblocks;

storing unique identity hashes associated with unique subblocks in a hash table;

updating the hash table with information for locating a unique subblock associated with an entry in the hash table; and in response to receiving an identity of $sb_i$ from an entity E2, locating a subblock $Sb_{transmit}$ from the respository of unique subblocks using the identity of the $sb_i$ and information for locating a unique subblock associated with the identity of $sb_i$;

and transmitting $Sb_{transmit}$ from a first entity E1 on which the respository of unique subblocks is stored to E2.

62. A method for organizing a block b of digital data for storage, communication, or comparison, comprising:

partitioning b into a plurality of subblocks at at least one position $k|k+1$ in b for which $b[k-A+1 \ldots k+B]$ satisfies a predetermined constraint, A and B being natural numbers, where data in $b[k-A+1 \ldots k+B]$ satisfies the predetermined constraint when a hash of at least a portion of the data in $b[k-A+1 \ldots k+B]$ produces a value that matches a predetermined constant value V determined from data not physically located in b, and where the hash depends, at least in part, on the probability $\rho$ of placing a boundary at an arbitrary position in a randomly generated block of data.

63. The method of claim 62, comprising:
selectively updating $\rho$ to tune the predetermined constraint to a desired application.

64. The method of claim 62, comprising:
selectively updating $\rho$ upon determining that an observed average subblock size differs from a desired average subblock size by more than a threshold amount.

65. The method of claim 62, comprising:
creating an identity hash for a member of the plurality of subblocks; and
selectively storing the identity hash in a collection of unique identity hashes upon determining that the identity hash does not appear in the collection of unique identity hashes.

66. The method of claim 65, comprising:
selectively storing the member of the plurality of subblocks in a collection of unique subblocks upon determining that the identity hash for the member does not appear in the collection of unique identity hashes.

67. The method of claim 66, the collection of unique identity hashes being stored in a hash table.

68. The method of claim 66, comprising:
organizing a second block B2 for storage, communications, or comparison by:
partitioning B2 into a second plurality of subblocks at at least one position $k/k+1$ in B2 for which $B2[k-A+1 \ldots k+B]$ satisfies the predetermined constraint.

69. The method of claim 68, comprising:
creating a candidate identity hash for a member of the second plurality of subblocks; and
selectively storing the candidate identity hash in the collection of unique identity hashes upon determining that the candidate identity hash does not appear in the collection of unique identity hashes.

70. The method of claim 69, comprising:
selectively storing the member of the second plurality of subblocks in the collection of unique subblocks upon determining that the candidate identity hash for the member does not appear in the collection of unique identity hashes.

71. The method of claim 66, comprising:
creating a projection of b comprising an identifier of b, zero or more of $sb_1 \ldots sb_n$, and zero or more identity hashes computed from $sb_1 \ldots sb_n$.

72. The method of claim 71, comprising:
identifying similarities between b and a second block B2 by comparing the projection of b to a projection of B2, where the projection of B2 was created using the same partitioning, hashing, and projection methods that were applied to create the projection of b.

73. The method of claim 67, comprising:
receiving a request to transfer a set of subblocks from a first computer housing the collection of unique identity hashes and the collection of unique subblocks to a second computer that is configured with a second collection of unique identity hashes and a second collection of unique subblocks that were created using the same partitioning and hashing methods used to create the collection of unique identity hashes and the collection of unique subblocks on the first computer; and
controlling the first computer to selectively transmit to the second computer members of the collection of unique subblocks by identifying members of the set of subblocks that are already present on the second computer based, at least in part, on the collection of unique identity hashes and the second collection of unique identity hashes.

74. The method of claim 1, where partitioning b into the plurality of subblocks $sb_1 \ldots sb_n$ is achieved without the use of framing information.

75. The method of claim 1, comprising:
partitioning b into multiple additional pluralities of subblocks using multiple different constraint functions.

76. The method of claim 75, comprising partitioning b into multiple additional pluralities of subblocks in one operation by using increasing constraints on a single function.

77. The method of claim 1, where two or more $sb_1 \ldots sb_n$ are found in parallel by evaluating F for two or more positions of the window in parallel.

78. A subblock server apparatus, comprising:
a computer configured to break blocks of data into subblocks, to hash the subblocks, and to store unique hashes and unique subblocks, where uniqueness is determined by reference to hashes of subblocks,
where the computer breaks blocks of data into subblocks by partitioning a block b into a plurality of subblocks $sb_1 \ldots sb_n$, at positions $k_x/k_x+1$ in b, n being an integer greater than 2, x being an integer less than n,
where a position $k_x/k_x+1$ in b is selected to partition b when data in a window $b[k_x-A+1 \ldots k_x+B]$ satisfies a predetermined constraint, A and B being natural numbers,
where data in the window $b[k_x-A+1 \ldots k_x+B]$ satisfies the predetermined constraint when a partitioning constraint function F applied to at least a portion of data in the window $b[k_x-A+1 \ldots k_x+B]$ produces a value that matches a predetermined constant value V,
where $F(b[k_x-A+1 \ldots k_x+B])$ hashes $b[k_x-A+1 \ldots k_x+B]$ using a hash function that depends, at least in part, on $\rho$, $\rho$ being the probability of placing a boundary at an arbitrary position in a randomly generated block of data.

79. The subblock server apparatus of claim 78, where the computer hashes the subblocks by calculating an identity hash for members of the plurality of subblocks $sb_1 \ldots sb_n$.

80. The subblock server apparatus of claim 79, where the computer stores the unique hashes in a hash table and stores the unique subblocks in an unordered data repository.

81. A method, comprising:
controlling a computer to:
partition a data set b into a set of subblocks $sb_1 \ldots sb_n$, n being an integer greater than two by:
creating a boundary $bnd_{xy}$ between two subblocks $sb_x$ and $sb_y$ in the set of subblocks at a position $k_{xy}/k_{xy}+1$ in b, x and y being integers greater than one and less than n, where position $k_{xy}/k_{xy}+1$ is selected upon determining that data in a boundary identification window covering $b[k_{xy}-A+1 \ldots k_{xy}+B]$ satisfies a partitioning constraint function, A and B being integers greater than or equal to zero, the boundary identification window covering $b[k_{xy}-A+1 \ldots k_{xy}+B]$ covering less than all of b;
creating a boundary $bnd_{yz}$ between two subblocks $sb_y$ and $sb_z$ in the set of subblocks at a position $k_{yz}/k_{yz}+1$ in the data set b, z being equal to y+1, where position $k_{yz}/k_{yz}+1$ is selected upon determining that data in a boundary identification window covering $b[k_{yz}-A+1 \ldots$ $k_{yz}+B]$ also satisfies the partitioning constraint function, $sb_y$ being a subblock bounded by position $k_{xy}/k_{xy}+1$ and position $k_{yz}/k_{yz}+1$;

where satisfying the partitioning constraint function occurs when a boundary identification hash of data in a boundary identification window in b covering less than all of b equals a pre-defined value, where the boundary identification hash depends, at least in part, on a probability of placing a boundary at an arbitrary position in b;

computing an identity hash for subblocks in the set of subblocks $sb_1 \ldots sb_n$;

identifying unique subblocks in the set of subblocks $sb_1 \ldots sb_n$ by comparing identity hashes;

storing unique subblocks from the set of subblocks of $sb_1 \ldots sb_n$ in a repository of unique subblocks;

storing identity hashes associated with unique subblocks from the set of subblocks $sb_1 \ldots sb_n$ in a hash table; and storing information in the hash table from which a unique subblock can be located using a corresponding identity hash.

82. The method of claim 81, comprising controlling a backup system to not store a duplicate subblock.

83. The method of claim 81, comprising controlling a communication system to not transmit a duplicate subblock.

84. The method of claim 81, comprising controlling a file system to not store a duplicate subblock.

85. The method of claim 81, comprising controlling a utility to identify similarities and differences between files by comparing identity hashes.

86. The method of claim 81, the repository of unique subblocks being unordered.

* * * * *